(12) United States Patent
Yamada

(10) Patent No.: US 10,468,332 B2
(45) Date of Patent: Nov. 5, 2019

(54) COOLER FOR COOLING A SEMICONDUCTOR DEVICE

(71) Applicant: FUJI ELECTRIC CO., LTD., Kanagawa (JP)

(72) Inventor: Toru Yamada, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/145,180

(22) Filed: Sep. 28, 2018

(65) Prior Publication Data
US 2019/0109069 A1  Apr. 11, 2019

(30) Foreign Application Priority Data
Oct. 6, 2017  (JP) .................. 2017-195974

(51) Int. Cl.
*H01L 23/473* (2006.01)
*H01L 23/367* (2006.01)
*H01L 23/40* (2006.01)

(52) U.S. Cl.
CPC .......... *H01L 23/473* (2013.01); *H01L 23/367* (2013.01); *H01L 23/3677* (2013.01); *H01L 23/40* (2013.01); *H01L 23/3672* (2013.01); *H01L 2225/06589* (2013.01)

(58) Field of Classification Search
CPC ......... H01L 2225/06589; H01L 23/367; H01L 23/3677; H01L 23/3672; H01L 23/473; H01L 23/40
See application file for complete search history.

(56) References Cited

U.S. PATENT DOCUMENTS

| 8,829,670 | B1* | 9/2014 | Zhang | H01L 23/473 257/713 |
|---|---|---|---|---|
| 2008/0291636 | A1* | 11/2008 | Mori | H01L 23/3735 361/709 |
| 2009/0185343 | A1* | 7/2009 | Wu | F28D 15/00 361/679.53 |
| 2009/0229864 | A1* | 9/2009 | Kuromitsu | H01L 23/3735 174/252 |
| 2010/0090336 | A1 | 4/2010 | Yoshida | |
| 2012/0139096 | A1 | 6/2012 | Gohara | |

(Continued)

FOREIGN PATENT DOCUMENTS

| JP | 2008172014 A | 7/2008 |
|---|---|---|
| JP | 2012533868 A | 12/2012 |
| JP | 2015225953 A | 12/2015 |

*Primary Examiner* — Ngan V Ngo

(57) ABSTRACT

Provided is a cooler including an upper plate configured to have a semiconductor chip to be arranged thereon, a plurality of plate-like fins arranged under the upper plate, and a coupling bar coupled to the plate-like fins. The coupling bar has a main-body portion and a plurality of comb-tooth portions protruding from the main-body portion into the flow channel, the cooler includes a plurality of openings in a plane orthogonal to an extending direction of the plate-like fins, and the openings are defined at least by the comb-tooth portions and the plate-like fins, and the openings include a first opening provided in a first flow channel that does not run below the semiconductor chip, and a second opening provided in a second flow channel that runs below the semiconductor chip, where the second opening is larger than the first opening.

15 Claims, 25 Drawing Sheets

(56) References Cited

U.S. PATENT DOCUMENTS

| | | | |
|---|---|---|---|
| 2012/0280383 A1* | 11/2012 | Taketsuna | H01L 21/4803 257/712 |
| 2015/0061109 A1* | 3/2015 | Iizuka | H01L 23/367 257/712 |
| 2016/0218048 A1* | 7/2016 | Kazemi | H01L 23/3672 |
| 2017/0323843 A1* | 11/2017 | Ganguly | H01L 23/467 |
| 2018/0023823 A1* | 1/2018 | Chen | F24F 5/0042 62/3.7 |
| 2018/0142968 A1* | 5/2018 | Deguchi | H01L 23/4735 |
| 2018/0269828 A1* | 9/2018 | Beck | H02S 40/44 |

* cited by examiner

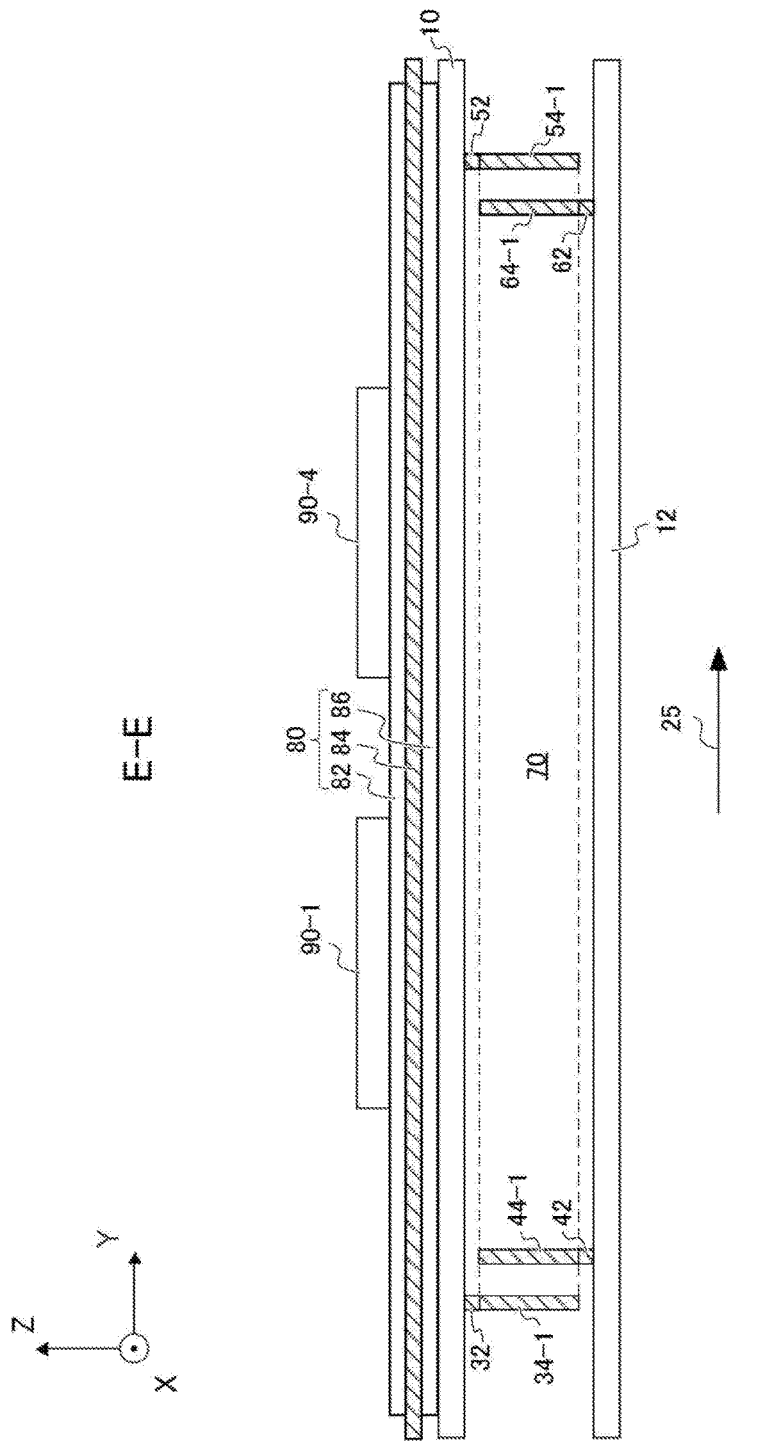

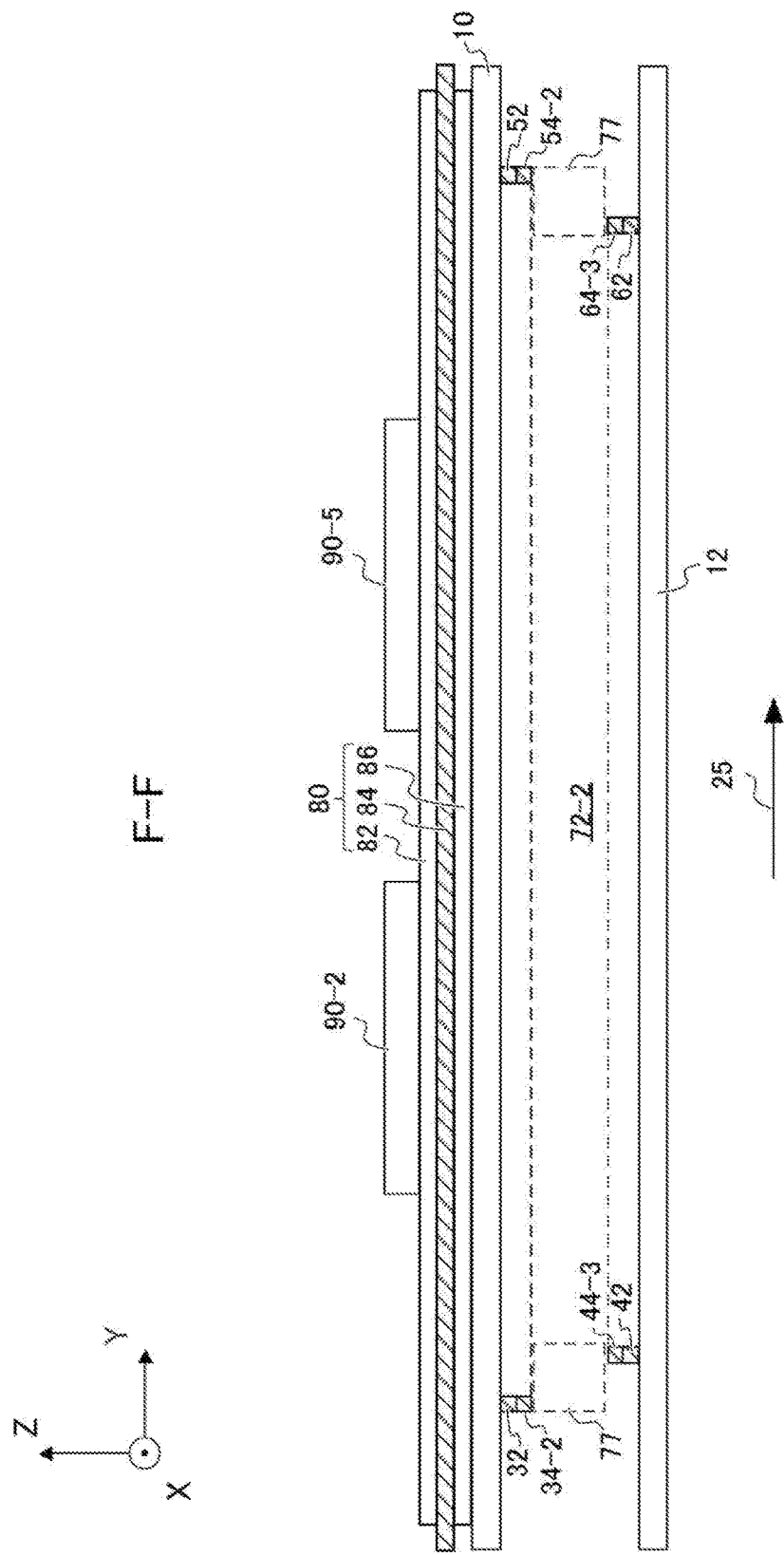

COOLER FOR COOLING A SEMICONDUCTOR DEVICE

The contents of the following Japanese patent application(s) are incorporated herein by reference: NO. 2017-195974 filed in JP on Oct. 6, 2017.

BACKGROUND

Technical Field

The present invention relates to a cooler.

In the conventional art, a cooler has a plurality of plate-like fins (see, for example, Patent Document 1). In addition, it is known to provide a protrusion in a coolant flow channel (see, for example, Patent Document 2) and to couple a plurality of fin plates using a coupling member (see, for example, Patent Document 3).

PRIOR ART DOCUMENTS

Patent Documents

Patent document 1: Japanese Patent Application Publication No. 2012-533868
Patent document 2: Japanese Patent Application Publication No. 2008-172014
Patent document 3: Japanese Patent Application Publication No. 2015-225953

In order to enable a cooler to more efficiently cool a semiconductor chip, it is desirable to lower the coolant flow rate in the region that makes a small contribution to the cooling and raise the coolant flow rate in the region that makes a large contribution to the cooling.

SUMMARY

A first aspect of the present invention provides a cooler configured to cool a semiconductor chip. The cooler may include an upper plate configured to have a semiconductor chip to be arranged thereon, a plurality of plate-like fins and a coupling bar. The plurality of plate-like fins may be arranged under the upper plate. The plurality of plate-like fins may form a flow channel for cooling water therebetween. The coupling bar may be coupled to the plurality of plate-like fins. The coupling bar may have a main-body portion and a plurality of comb-tooth portions, and each of the comb-tooth portions may protrude from the main-body portion into the flow channel. The cooler may include a plurality of openings in a plane orthogonal to an extending direction, and the plurality of openings may be defined at least by the plurality of comb-tooth portions and the plurality of plate-like fins . The extending direction may be a direction in which the plurality of plate-like fins extend when the cooler is seen from above. The plurality of openings may include a first opening that is provided in a first flow channel that does not run below the semiconductor chip, and a second opening that is provided in a second flow channel that runs below the semiconductor chip. The second opening may be larger than the first opening.

The coupling bar may include a front upper coupling bar and a front lower coupling bar. The front upper coupling bar and the front lower coupling bar may be differently positioned in the extending direction between an inlet of the cooling water and a region that is positioned below the semiconductor chip. The front upper coupling bar may be positioned closer to the inlet of the cooling water than to the region that is positioned below the semiconductor chip. The front upper coupling bar may be coupled with upper portions of the plurality of plate-like fins. The front lower coupling bar may be positioned closer to the region that is positioned below the semiconductor chip than to the inlet of the cooling water. The front lower coupling bar may be coupled with lower portions of the plurality of plate-like fins.

In the second flow channel that runs below the semiconductor chip, the comb-tooth portions of the front lower coupling bar may not overlap the comb-tooth portions of the front upper coupling bar in the extending direction.

In the first flow channel that does not run below the semiconductor chip, the comb-tooth portions of the front lower coupling bar may at least partly overlap the comb-tooth portions of the front upper coupling bar in the extending direction.

In the first flow channel that does not run below the semiconductor chip, upper ends of the comb-tooth portions of the front lower coupling bar may be positioned higher than a lower end of the main-body portion of the front upper coupling bar. Alternatively, in the first flow channel, lower ends of the comb-tooth portions of the front upper coupling bar may be positioned lower than an upper end of the main-body portion of the front lower coupling bar.

The cooler may include a plurality of second flow channels. The plurality of second flow channels may each include, in a plane that is positioned between the front upper coupling bar and the inlet and orthogonal to the extending direction, one of a large through hole and a small through hole. The large through hole may include an overlap in the extending direction between the second opening and a fourth opening. An upper end of the second opening may be defined by the comb-tooth portions of the front upper coupling bar. A lower end of the fourth opening may be defined by the comb-tooth portions of the front lower coupling bar. The fourth opening in the large through hole may be a fourth opening having a relatively larger opening area. The small through hole may include an overlap in the extending direction between the second opening and the fourth opening. The fourth opening in the small through hole may be a fourth opening having a relatively smaller opening area.

The inlet and an outlet of the cooling water may be differently positioned in the extending direction with the plurality of plate-like fins being sandwiched therebetween. The cooler may include a plurality of the second flow channels. The plurality of second flow channels may each include, in a plane that is positioned between the front upper coupling bar and the inlet and orthogonal to the extending direction, one of a large through hole and a small through hole. The small through hole may be positioned closer to the inlet or the outlet than the large through hole is.

The inlet and an outlet of the cooling water may be both provided on a same side with respect to the plurality of plate-like fins in the extending direction. The cooler may include a plurality of the second flow channels. The plurality of second flow channels may each include, in a plane that is positioned between the front upper coupling bar and the inlet and orthogonal to the extending direction, one of a large through hole having a relatively larger opening area and a small through hole having a relatively smaller opening area. The large through hole may be positioned closer to the inlet and the outlet than the small through hole is.

The cooler may further include at least one coupling bar that is positioned between the region that is positioned below the semiconductor chip and an outlet of the cooling water in the extending direction.

The cooler may include a back upper coupling bar and a back lower coupling bar that correspond to the at least one coupling bar and are differently positioned in the extending direction between the region that is positioned below the semiconductor chip and the outlet of the cooling water. The back upper coupling bar may be positioned closer to the outlet of the cooling water than to the region that is positioned below the semiconductor chip. The back upper coupling bar may be coupled with the upper portions of the plurality of plate-like fins. The back lower coupling bar may be positioned closer to the region that is positioned below the semiconductor chip than to the outlet of the cooling water. The back lower coupling bar may be coupled with the lower portions of the plurality of plate-like fins.

A distance between the front upper coupling bar and the front lower coupling bar may be shorter than a distance between the back upper coupling bar and the back lower coupling bar.

In the first flow channel that does not run below the semiconductor chip, a length of an overlap, in the extending direction, between the comb-tooth portions of the front upper coupling bar and the comb-tooth portions of the front lower coupling bar may be larger than a length of an overlap, in the extending direction, between the comb-tooth portions of the back upper coupling bar and the comb-tooth portions of the back lower coupling bar.

In the second flow channel that runs below the semiconductor chip, a protruding length of the comb-tooth portions of the back lower coupling bar may be larger than a protruding length of the comb-tooth portions of the front lower coupling bar.

The plurality of plate-like fins may each have a depression. In the depression, the coupling bar may be arranged. The depression may have a protrusion. The protrusion may be in contact with the coupling bar in a direction parallel to the extending direction.

The coupling bar may include at least two coupling bars. The at least two coupling bars may be spaced away from each other in the extending direction and positioned between an inlet of the cooling water and a region that is positioned below the semiconductor chip, or between the region that is positioned below the semiconductor chip and an outlet of the cooling water. A distance between two of the coupling bars in the extending direction may be equal to or larger than a thickness, in the extending direction, of a main-body portion of each of the two coupling bars.

The summary clause does not necessarily describe all necessary features of the embodiments of the present invention. The present invention may also be a sub-combination of the features described above.

BRIEF DESCRIPTION OF THE DRAWINGS

FIG. 6 also includes a view (B) showing first flow channels 70 and second flow channels 72 in the B-B cross-section.

FIG. 7 also includes a view (B) showing the first flow channels 70 and the second flow channels 72 in the C-C cross-section.

FIG. 9B shows a cross-section taken along the line E-E in FIG. 2.

FIG. 9C shows a cross-section taken along the line F-F in FIG. 2.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
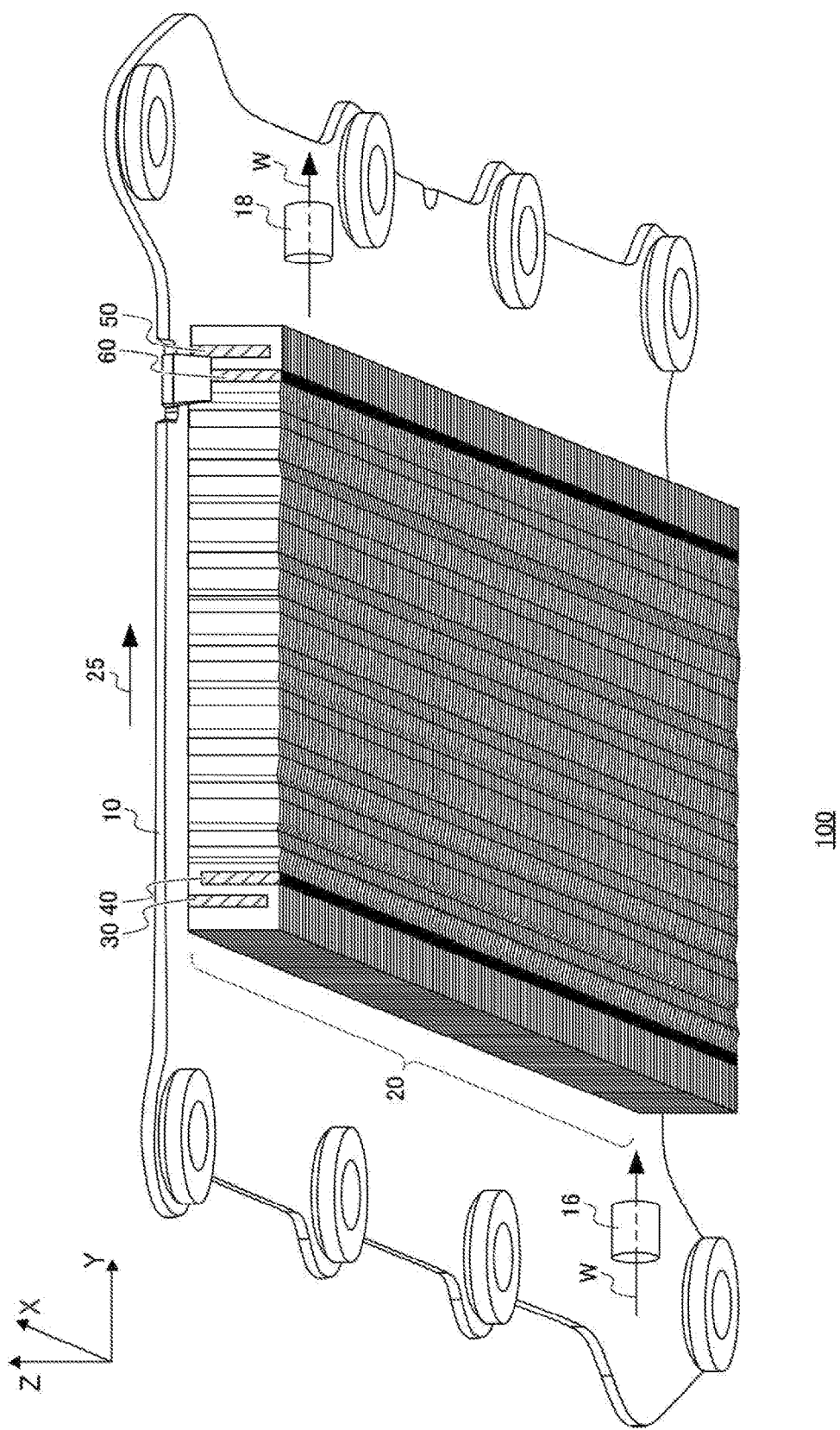
FIG. 1 is a perspective view showing a cooler 100 relating to a first embodiment.

FIG. 1 is a perspective view showing a cooler 100 relating to a first embodiment. For the purpose of better understanding, FIG. 1 shows an upper plate 10, an inlet 16 and an outlet 18 for cooling water, a plurality of plate-like fins 20, and coupling bars 30, 40, 50 and 60 included in the cooler 100. Note that FIG. 1 does not show a lower plate 12 and side plates 14, which will be described later. In FIG. 1, the arrows W indicate the direction in which the cooling water mainly flows through the inlet 16 and the outlet 18.

In the present example, the Z axis is orthogonal to the X axis and the Y axis. In the present example, the X, Y and Z axes define the right-handed system. The X, Y and Z axes are used to represent the relative directions in the cooler 100, a semiconductor module 200, which will be described later, and the like. Here, the Z-axis direction is not necessarily parallel to the gravitational direction. As used herein, the terms "above," "upper," "below," "lower" and the like are associated with the direction parallel to the Z-axis direction, but these terms are also not limited to mean the relative position in the gravitational direction. Here, the position that is relatively close to the inlet 16 may be referred to using the terms "upstream" and "front," and the position that is relatively close to the outlet 18 may be referred to using the terms "downstream" and "back."

The cooler 100 may be capable of cooling a semiconductor chip to be provided on the upper plate 10. The cooler 100 is also referred to as a heat sink. The upper plate 10 may constitute a part of the case through which cooling water flows from the inlet 16 to the outlet 18. The cooler 100 has a plurality of plate-like fins 20 housed within the case. This means that the plate-like fins 20 are arranged below the upper plate 10. The heat generated from the semiconductor chip may be transferred to the cooling water at least via the upper plate 10 and the plate-like fins 20. The cooler 100 may cool the semiconductor chip based on the thermal exchange between the cooling water and the combination of the upper plate 10 and the plate-like fins 20.

Between the respective plate-like fins 20, the flow channels may be formed for the cooling water. A pump may be provided outside the cooler 100. The pump may provide power to flow the cooling water through the flow channels formed between the plate-like fins 20. In each flow channel, the cooling water may flow from the position corresponding to the front end (the end in the −Y direction) of the plate-like fins 20 to the position corresponding to the back end (the end in the +Y direction) of the plate-like fins 20. Note that the cooling water may be the mixture of water and ethylene glycol or pure water. The cooling water may alternatively be the mixture of water and a different long life coolant (LLC). The cooling water may be a different type of cooling fluid.

When the cooler 100 is seen from above, the plate-like fins 20 may extend in a particular direction. In the present example, the reference numeral 25 represents the extending direction of the plate-like fins 20, which is aligned with the Y-axis direction. In the present example, the plate-like fins 20 each include a zigzag portion extending in the Y-axis direction. In a different example, however, the plate-like fins 20 each may include a straight portion extending in the Y-axis direction in place of the zigzag portion.

The coupling bars 30, 40, 50 and 60 may be coupled to the plate-like fins 20 to provide a predetermined spacing between the adjacent ones of the plate-like fins 20 in the X-axis direction. For example, when the depressions of the coupling bars, which are formed by the main-body portion and two of the comb-tooth portions, mesh the depressions of the plate-like fins 20, the coupling bars are coupled with the plate-like fins 20. As a result of the coupling, the relative positions of the coupling bars and the plate-like fins 20 may be fixed. The plate-like fins 20 may be arranged in parallel with each other in such a manner that the individual plate-like fins 20 extend in a parallel direction to each other and the adjacent ones of the plate-like fins 20 are spaced away from each other with a predetermined distance provided therebetween.

In the present example, the coupling bar 30 corresponds to a front upper coupling bar, the coupling bar 40 corresponds to a front lower coupling bar, the coupling bar 50 corresponds to a back upper coupling bar, and the coupling bar 60 corresponds to a back lower coupling bar. In the present example, the coupling bars 30 and 50 are coupled to the upper portion of the plate-like fins 20. On the other hand, the coupling bars 40 and 60 are coupled to the lower portion of the plate-like fins 20 in the present example. In the present example, the coupling bars 30 and 40 are positioned upstream relative to the coupling bars 50 and 60. In addition, in the present example, the coupling bar 30 is positioned upstream relative to the coupling bar 40, and the coupling bar 50 is positioned downstream relative to the coupling bar 60.

Figure 2:
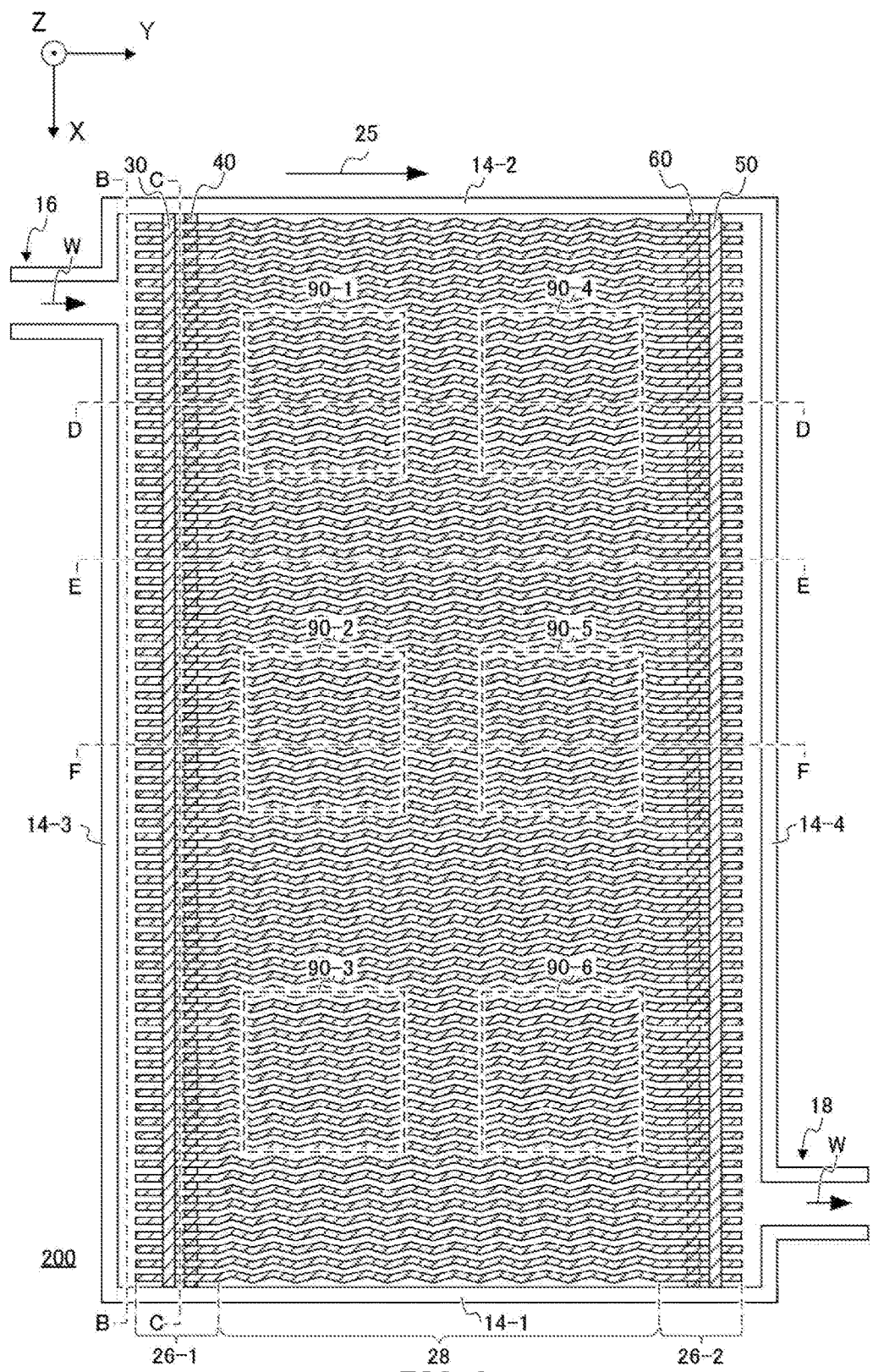
FIG. 2 is a top view showing a semiconductor module 200 having the cooler 100.

FIG. 2 is a top view showing the semiconductor module 200 having the cooler 100. As shown in FIG. 2, the cooler 100 includes a side plate 14-1 that serves as the edge in the +X direction, a side plate 14-2 that serves as the edge in the −X direction, a side plate 14-3 that serves as the front edge (the edge in the −Y direction), and a side plate 14-4 that serves as the back edge (the edge in the +Y direction). Note that three semiconductor chips 90 are arranged next to each other in the X-axis direction and two in the Y-axis direction in the present example. In total, six semiconductor chips 90 (=3×2) are provided on the upper plate 10. FIG. 2 does not show the constituents above the upper plate 10 and thus uses the dotted lines to represent the regions that are positioned below the semiconductor chips 90.

In the present example, the inlet 16 of the cooling water is coupled to the front side plate 14-3, and the outlet 18 of the cooling water is coupled to the back side plate 14-4. The inlet 16 and the outlet 18 may be differently positioned in the extending direction 25 with the plate-like fins 20 being sandwiched therebetween. In the present example, the inlet 16 and the outlet 18 are point-symmetrically positioned with respect to the center of the rectangle that is observed when the cooler 100 is seen from above. The inlet 16 and the outlet 18 may be positioned on the diagonal line of the rectangle.

In the present example, the plate-like fins 20 each include straight portions 26 that are parallel to the Y-axis direction and a wave-shaped portion 28 that extends in a zigzag manner in the Y-axis direction. In the present example, the straight portions 26 of each plate-like fin 20 are positioned in the vicinity of the inlet 16 and in the vicinity of the outlet 18, and the wave-shaped portion 28 of each plate-like fin 20 extends continuously between the two straight portions 26.

In the cooler 100, at least two of the coupling bars may be spaced away from each other in the extending direction 25. A plurality of coupling bars may be positioned on the straight portions 26-1 positioned in the vicinity of the inlet 16. In the present example, a pair of coupling bars 30 and 40 is provided on the straight portions 26-1 positioned in the vicinity of the inlet 16. Since the pair of coupling bars 30 and 40 is coupled with the straight portions 26-1 of the plate-like fins 20, a simplified coupling structure can be employed between the pair of coupling bars 30 and 40 and the plate-like fins 20 and more rigid coupling can be achieved between the pair of coupling bars 30 and 40 and the plate-like fins 20, when compared with the case where the pair of coupling bars 30 and 40 is coupled with the wave-shaped portions 28 of the plate-like fins 20.

The coupling bars 30 and 40 may be differently positioned in the extending direction 25 between the inlet 16 of the cooling water and the regions positioned below the semiconductor chips 90. In the present example, the coupling bars 30 and 40 are provided on the straight portions 26-1 in the vicinity of the inlet 16, which are positioned upstream relative to the regions positioned below the semiconductor chips 90. The coupling bar 30 of the present example is closer to the inlet 16 of the cooling water than to the regions positioned below the semiconductor chips 90, and the coupling bar 40 of the present example is closer to the regions positioned below the semiconductor chips 90 than to the inlet 16 of the cooling water.

Since the cooling water flows in vigorously in the vicinity of the inlet 16, the kinetic energy of the cooling water is higher than in the vicinity of the outlet 18. Therefore, in place of a single coupling bar, the pair of upper and lower coupling bars 30 and 40 is used, to partially block the flow of the cooling water in the present example In this manner, through holes, which will be described later, can be defined by shorter comb-tooth portions when compared with the case where the through holes are defined by the comb-tooth portions of a single coupling bar. Such configurations can lower the physical load applied on the coupling bars by the cooling water. In addition, the flow velocity of the cooling water can be adjusted to an appropriate level. Furthermore, since the upper coupling bar 30 is positioned upstream relative to the lower coupling bar 40, the flow in the Z-axis direction can be regulated. For example, in the regions positioned below the semiconductor chips 90 in the flow channels of the cooling water, the cooling water can achieve a higher flow velocity in the upper portion (the portion closer to the chips) than in the lower portion. Accordingly, the cooling water can more efficiently remove the heat from the upper plate 10.

At least one coupling bar may be provided between the regions positioned below the semiconductor chips 90 and the outlet 18 of the cooling water in the extending direction 25. In this manner, the plate-like fins 20 can be more stably fixed in the X-axis direction. In the present example, the cooler 100 has a pair of coupling bars 50 and 60 that are provided on the straight portions 26-2 in the vicinity of the outlet 18. Note that, in a different example, only a single or no coupling bar may be provided on the straight portions 26-2 in the vicinity of the outlet 18. According to the different example in which only a single coupling bar is provided in the vicinity of the outlet 18, the number of parts constituting the cooler 100 can be reduced, which can reduce the cost and time of manufacturing the cooler 100, for example The coupling bars 50 and 60 may be differently positioned in the extending direction 25 between the regions positioned below the semiconductor chips 90 and the outlet 18 of the cooling water. In the present example, the coupling bars 50 and 60 are provided on the straight portions 26-2 in the vicinity of the outlet 18, which are positioned downstream relative to the regions positioned below the semiconductor chips 90. The coupling bar 50 of the present example is closer to the outlet 18 of the cooling water than to the regions positioned below the semiconductor chips 90, and the coupling bar 60 of the present example is closer to the regions positioned below the semiconductor chips 90 than to the outlet 18 of the cooling water.

Since the cooler 100 of the present example is symmetrically structured between the upstream and the downstream, the flowing direction of the cooling water may be reversed when compared with the present example. This means that the outlet 18 of the present example may be alternatively configured as the inlet of the cooling water and that the inlet 16 of the present example may be alternatively configured as the outlet of the cooling water. The present example has advantages over the case where the cooler 100 is not symmetrically structured between the upstream and the downstream in terms of that the semiconductor module 200 can be easily assembled.

Figure 3A:
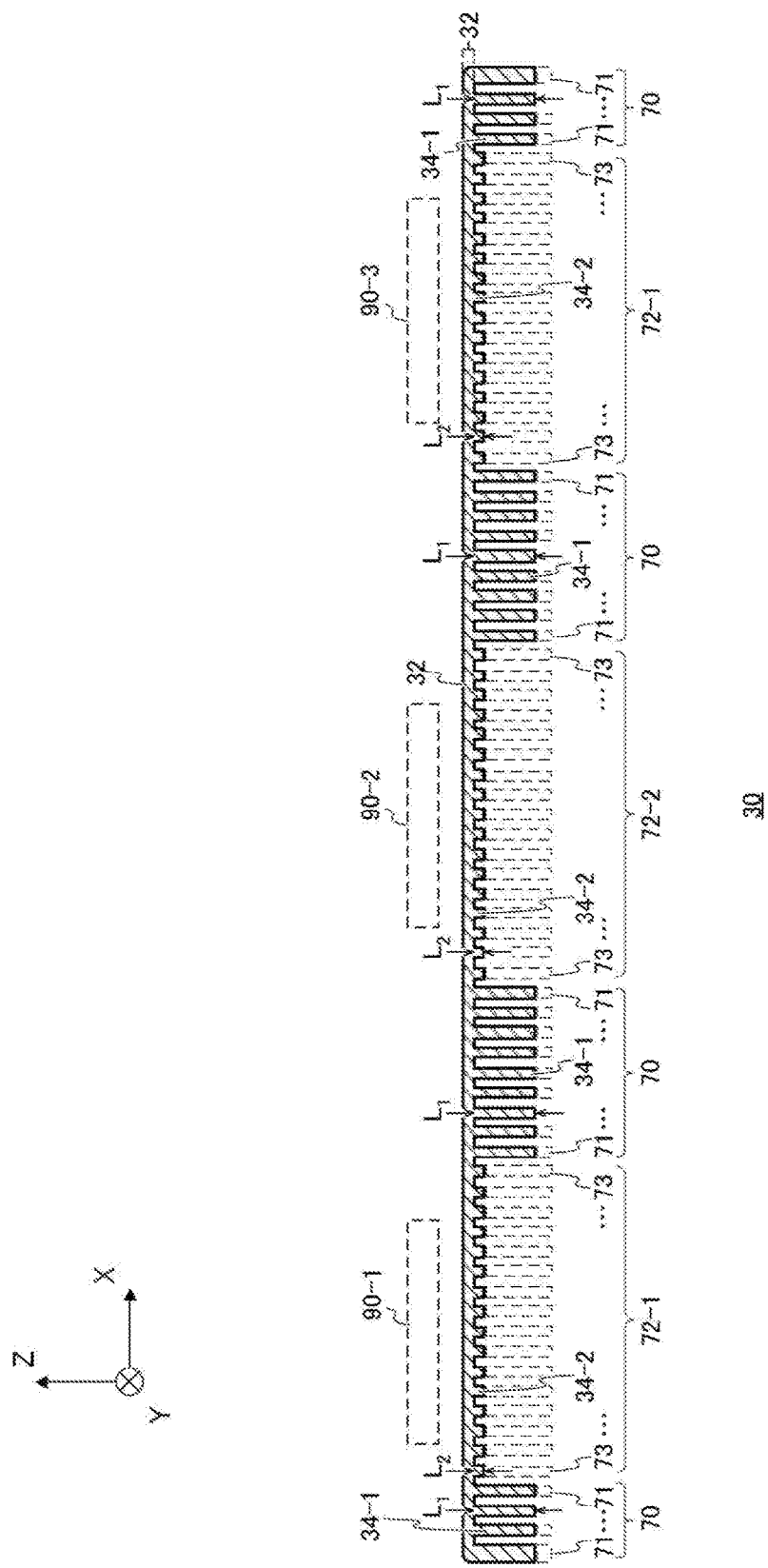
FIG. 3A shows a coupling bar 30.

FIG. 3A shows the coupling bar 30. FIG. 3A uses the solid lines to indicate the coupling bar 30. On the other hand, FIG. 3A uses the dotted lines to indicate the semiconductor chips 90 provided on the upper plate 10, first openings 71 provided in first flow channels 70 and second openings 73 provided in second flow channels 72. In the present example, the first flow channels 70 do not run below the semiconductor chips 90, and the second flow channels 72 run below the semiconductor chips 90. The differences between second flow channels 72-1 and second flow channels 72-2 will be described later.

In the present example, the coupling bar 30 includes a main-body portion 32 and a plurality of comb-tooth portions 34. The comb-tooth portions 34 may each protrude from the main-body portion 32 into the flow channels through which the cooling water flows. In the present example, the comb-tooth portions 34 extend from the main-body portion 32 in the −Z direction. The main-body portion 32 may have the same Z-axis length across any different positions thereof in the X-axis direction. On the contrary, the comb-tooth portions 34 may have different Z-axis lengths between different positions thereof in the X-axis direction.

The comb-tooth portions 34 may have different Z-axis lengths depending on whether they are positioned in the first flow channels 70 or the second flow channels 72. In the coupling bar 30 of the present example, comb-tooth portions 34-1 positioned in the first flow channels 70 have a larger Z-axis length than the comb-tooth portions 34-2 positioned in the second flow channels 72. In the coupling bar 30 of the present example, the comb-tooth portions 34-1 positioned in the first flow channels 70 have a Z-axis length L1, and the comb-tooth portions 34-2 positioned in the second flow channels 72 have a Z-axis length L2 (L2<L1). Note that, in the present example, the Z-axis length of the comb-tooth portions 34 is defined as the length from the lower end of the main-body portion 32 to the lower end of the comb-tooth portions 34. The comb-tooth portions 34 may each have the same width in the X direction.

The upper end of the first openings 71 and the second openings 73 may be defined by the comb-tooth portions 34. The lower end of the first openings 71 and the second openings 73 may be defined by the upper edge of a lower plate 12, which will be described later. The respective ends in the X-axis direction of the first openings 71 and the second openings 73 may be defined by two of the plate-like fins 20 that are next to each other in the X-axis direction. Note that, however, the end surface in the +X direction of the last first opening 71 in the +X direction may be defined by the side plate 14-1. Likewise, the end surface in the −X direction of the last first opening 71 in the −X direction may be defined by the side plate 14-2.

In the coupling bar 30, one first opening 71 has a smaller opening area than one second opening 73. The opening area may denote the area of the opening when the opening is seen in the Y-axis direction, which is shown in FIG. 3A. In the present example, the sum of the opening areas of the first openings 71 positioned in the first flow channels 70 is also smaller than the sum of the opening areas of the second openings 73 positioned in the second flow channels 72. In the present example, the number of the first openings 71 is smaller than the number of the second openings 73. Since the first openings 71 are smaller than the second openings 73, the flow rate of the cooling water can be reduced in the first flow channels 70, which make small contribution to the cooling of the semiconductor chips 90, and raised in the second flow channels 72, which make large contribution to the cooling of the semiconductor chips 90. With such configurations, the semiconductor chips 90 can be cooled more efficiently when compared with the case where the first openings 71 and the second openings 73 have the same area.

Figure 3B:
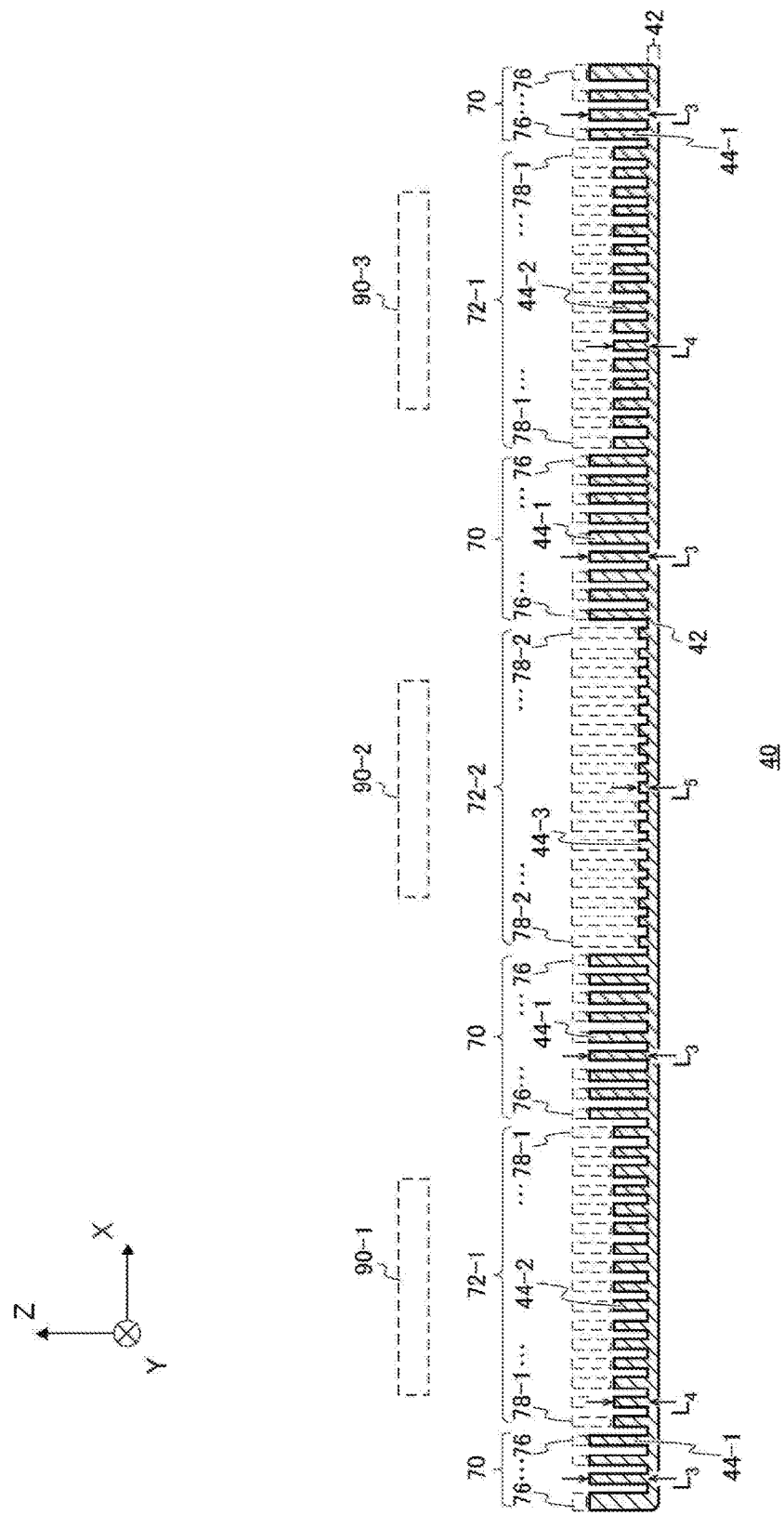
FIG. 3B shows a coupling bar 40.

FIG. 3B shows the coupling bar 40. As in FIG. 3A, FIG. 3B uses the solid lines to indicate the coupling bar 40. On the other hand, FIG. 3B uses the dotted lines to indicate the semiconductor chips 90, third openings 76 and fourth openings 78. In the present example, the third openings 76 have the same opening area as the first openings 71. In the present example, the fourth openings 78 have a larger opening area than the third openings 76.

The coupling bar 40 may include a main-body portion 42 and a plurality of comb-tooth portions 44. The comb-tooth portions 44 may each protrude from the main-body portion 42 into the flow channels through which the cooling water flows. In the present example, the comb-tooth portions 44 extend from the main-body portion 42 in the +Z direction. The main-body portion 42 may have the same Z-axis length across any different positions thereof in the X-axis direction. On the contrary, the comb-tooth portions 44 may have different Z-axis lengths between different positions thereof in the X-axis direction.

Also in the coupling bar 40, the comb-tooth portions 44 may have different Z-axis lengths depending on whether they are positioned in the first flow channels 70 or the second flow channels 72. In the coupling bar 40 of the present example, comb-tooth portions 44-1 positioned in the first flow channels 70 have a larger Z-axis length than the comb-tooth portions 44-2 and 44-3 positioned in the second flow channels 72. In the coupling bar 40 of the present example, the comb-tooth portions 44-1 positioned in the first flow channels 70 have a Z-axis length L3, and the comb-tooth portions 44-2 and 44-3 positioned in the second flow channels 72 respectively have a Z-axis length L4 and a Z-axis length L5 (L4, L5<L3). Here, the Z-axis length L3 may be equal to the Z-axis length L1 of the comb-tooth portions 34-1 positioned in the first flow channels 70 of the coupling bar 30 (L3=L1). Note that, in the present example, the Z-axis length of the comb-tooth portions 44 is defined as the length from the upper end of the main-body portion 42 to the upper end of the comb-tooth portions 44. The comb-tooth portions 44 may each have the same width in the X direction.

In the present example, a semiconductor chip 90-2 is positioned between the inlet 16 of the cooling water and the outlet 18 in the X-axis direction. In addition, semiconductor chips 90-1 and 90-3 are positioned in the two regions that sandwich in the X-axis direction the region in which the semiconductor chip 90-2 is positioned. In the second flow channel 72-2 positioned below the semiconductor chip 90-2, the comb-tooth portions 44-3 have the Z-axis length L5. On the other hand, in the second flow channels 72-1 positioned below the semiconductor chips 90-1 and 90-3, which sandwich the semiconductor chip 90-2 in the X-axis direction, the comb-tooth portions 44-2 have the Z-axis length L4. In the present example, the length L4 is larger than the length L5 (L5<L4). The Z-axis length L5 may be equal to the Z-axis length L2 of the comb-tooth portions 34-2 of the coupling bar 30 that are positioned in the second flow channels 72 (L5=L2). The second flow channels 72-1 and the second flow channel 72-2 may be parallel to the Y-axis direction with the first flow channels 70 being sandwiched therebetween. In addition, the second flow channel 72-2 may be arranged between the two second flow channels 72-1 in the X-axis direction.

In the present example, the fourth openings 78 include fourth openings 78-1 that have a relatively small opening area and fourth openings 78-2 that have a relatively large opening area. The fourth openings 78-1 are openings the lower ends of which are defined by the comb-tooth portions 44-2 having the length L4 and the fourth openings 78-2 are openings the lower ends of which are defined by the comb-tooth portions 44-3 having the length L5. Note that, in the present example, the fourth openings 78-2 have the same opening area as the second opening 73.

The upper end of the third openings 76 and the fourth openings 78 may be defined by the lower edge of the upper plate 10. The respective ends in the X-axis direction of the third openings 76 and the fourth openings 78 may be defined by two of the plate-like fins 20. Note that, however, the end surface in the +X direction of the last third opening 76 in the +X direction may be defined by the side plate 14-1. Likewise, the end surface in the −X direction of the last third opening 76 in the −X direction may be defined by the side plate 14-2.

Also in the coupling bar 40, one third opening 76 has a smaller opening area than one fourth opening 78. In the present example, the sum of the opening areas of the third openings 76 positioned in the first flow channels 70 is also smaller than the sum of the opening areas of the fourth openings 78 positioned in the second flow channels 72. Furthermore, in the present example, the number of the third openings 76 is also smaller than the number of the fourth openings 78.

Since the third openings 76 are smaller than the fourth openings 78 also in the coupling bar 40, the flow rate of the cooling water can be also reduced in the first flow channels 70, which make small contribution to the cooling of the semiconductor chips 90, and raised in the second flow channels 72, which make large contribution to the cooling of the semiconductor chips 90. In addition, in the coupling bar 40, the fourth openings 78-2 in the second flow channel 72-2, which is the most distant in the X-axis direction from the inlet 16 and the outlet 18, are larger than the fourth openings 78-1 in the second flow channels 72-1, which are the closest in the X-axis direction to the inlet 16 or the outlet 18. With such configurations, the area of the overlap in the extending direction 25 between the second openings 73 and the fourth openings 78-2 in the second flow channel 72-2 is larger than the area of the overlap in the extending direction 25 between the second openings 73 and the fourth openings 78-1 in the second flow channels 72-1. When the second flow channels 72 are seen in the Y-axis direction, the openings are defined as the gap between the end of the comb-tooth portions 34 and the end of the comb-tooth portions 44 and have a larger Z-axis length in the second flow channel 72-2 than in the second flow channels 72-1. Accordingly, the present embodiment can reduce the imbalance in the flow rate of the cooling water among the second flow channels 72.

Figure 4:
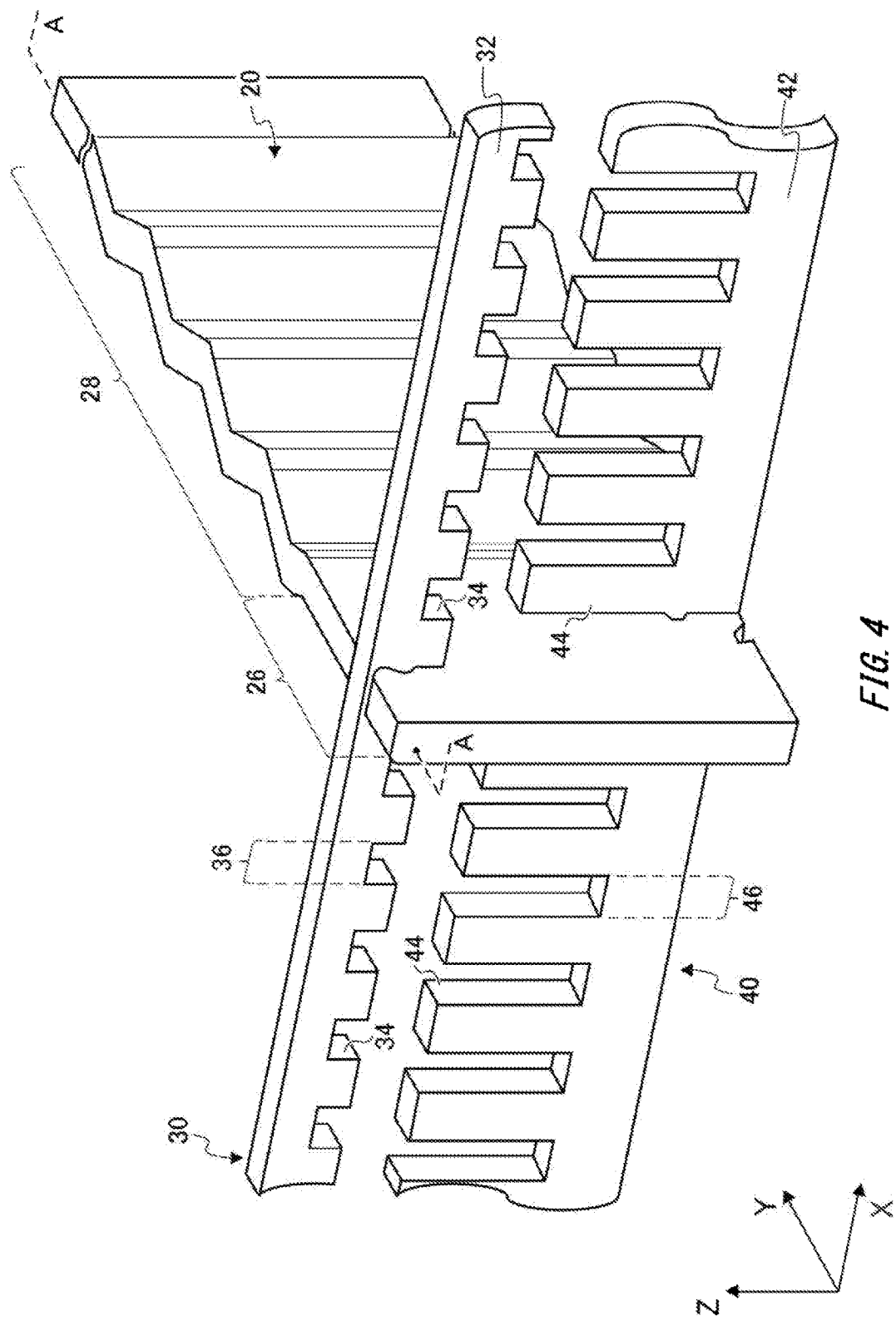
FIG. 4 is a perspective view showing how one plate-like fin 20 is positioned relative to the coupling bar 30 and the coupling bar 40.

FIG. 4 is a perspective view showing how one plate-like fin 20 is positioned relative to the coupling bar 30 and the coupling bar 40. In the present example, the coupling bar 40 is positioned downstream (in the +Y direction) relative to the coupling bar 30. The coupling bar 30, which is positioned closer to the upper plate 10 and the semiconductor chips 90, is positioned upstream relative to the coupling bar 40. In addition, in the present example, the comb-tooth portions 34 face the comb-tooth portions 44 in the Z-axis direction but do not overlap in the Z-axis direction. In the present example, the straight portion 26 of the plate-like fin 20 is positioned to mesh in the Z-axis direction a depression 36 of the coupling bar 30 and a depression 46 of the coupling bar 40.

Figure 5:
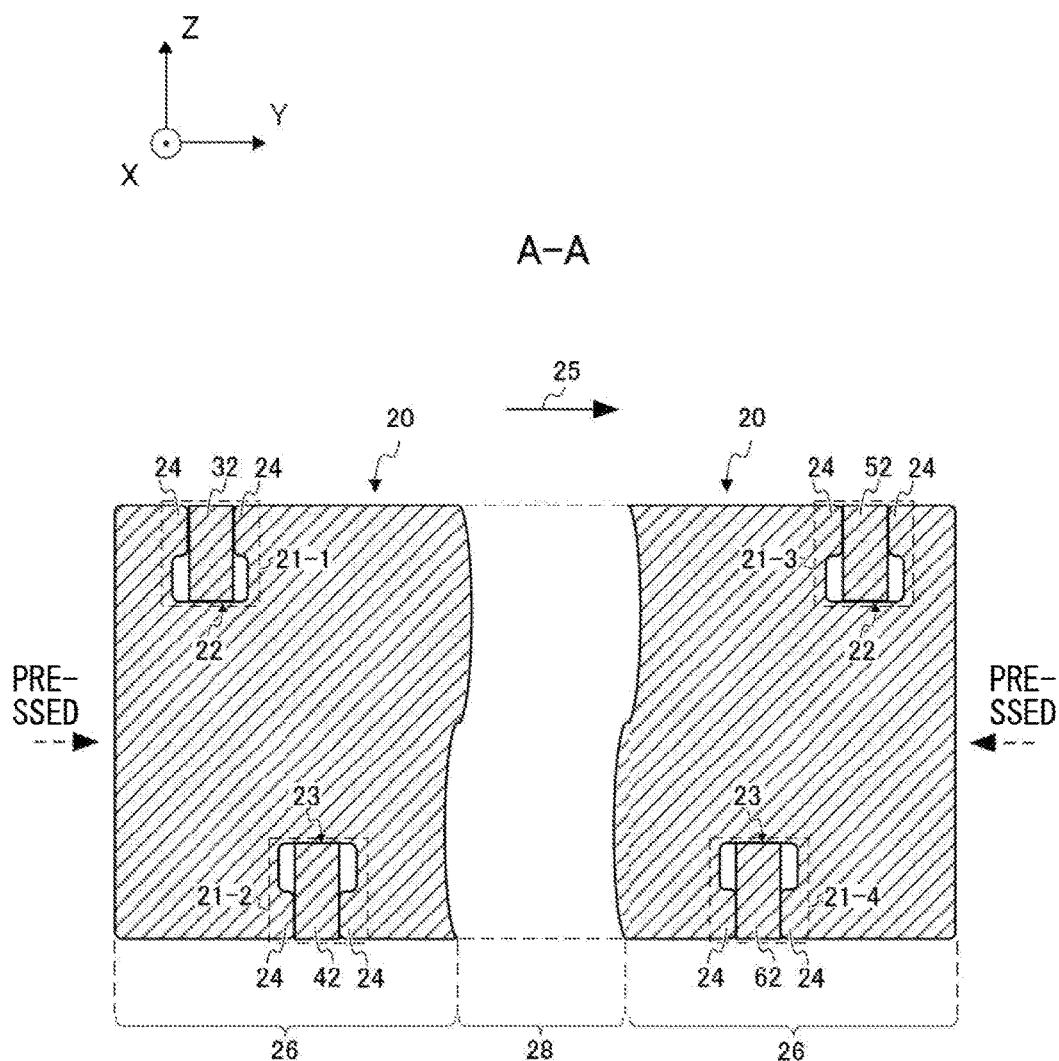
FIG. 5 shows a cross-section taken along the line A-A in FIG. 4.

FIG. 5 shows a cross-section taken along the line A-A in FIG. 4. FIG. 5 shows the cross-section parallel to the Y-Z plane passing through the plate-like fin 20. Here, FIG. 5 shows not only the upstream straight portion 26 but also the downstream straight portion 26. The plate-like fin 20 may have depressions 21. The depressions 21 may each also have protrusions 24. In the present example, the depressions 21 are notches indented in the +Z or −Z direction in the plate-like fin 20. In the plate-like fin 20, one depression 21 may be positioned where the plate-like fin 20 is coupled with a corresponding one of the coupling bars. In the present example, the plate-like fin 20 has depressions 21-1 and 21-3 that are both on the upper edge and respectively correspond to the upstream and downstream coupling bars 30 and 50, and depressions 21-2 and 21-4 that are both on the lower edge and respectively correspond to the upstream and downstream coupling bars 40 and 60.

The depression 21-1 on the upper edge may have a bottom portion 22 with which the lower portion of the main-body portion 32 is in contact. Likewise, the depression 21-3 may have a bottom portion 22 with which the lower portion of the main-body portion 52 is in contact. The bottom portions 22 of the depressions 21 may be respectively attached to the bottom portions of the main-body portions 32 and 52 using a wax material. After the coupling bars have been coupled with the depressions 21, the upper portions of the main-body portions 32 and 52 and the upper portion of the plate-like fin 20 may form a substantially flat surface free from protrusions.

The depression 21-2 on the lower edge may have a top portion 23 with which the upper portion of the main-body portion 42 is in contact. Likewise, the depression 21-4 may have a top portion 23 with which the upper portion of the main-body portion 62 is in contact. The top portions 23 of the depressions 21 may be respectively attached to the top portions of the main-body portions 42 and 62 using a wax material. After the coupling bars have been coupled with the depressions 21, the lower portions of the main-body portions 42 and 62 and the lower portion of the plate-like fin 20 may form a substantially flat surface free from protrusions.

The protrusions 24 may be provided in the upper portions of the depressions 21-1 and 21-3 on the upper edge of the plate-like fin 20 and in the lower portions of the depressions 21-2 and 21-4 on the lower edge of the plate-like fin 20. The protrusions 24 may protrude in the extending direction 25. The protrusions 24 may be in contact with the coupling bars positioned in the depressions 21 in the direction parallel to the extending direction 25. This can rigidly fasten the plate-like fin 20 and the coupling bars together. In the present example, the plate-like fin 20 has two protrusions 24 in each one of the depressions 21. In a different example, however, one protrusion 24 may be provided in each one of the depressions 21.

In the depression 21-1 of the present example, the length of the spacing between the two protrusions 24 facing each other in the Y-axis direction is smaller than the Y-axis length of the main-body portion 32 of the coupling bar 30. Likewise, in each of the depressions 21-2, 21-3 and 21-4, the length of the spacing between the two protrusions 24 facing each other in the Y-axis direction is smaller than the Y-axis length of the main-body portions 42, 52 and 62. When the main-body portion 32 of the coupling bar 30 meshes the pair of protrusions 24, the protrusions 24 may be pressed by the main-body portion 32 and thus deformed. The restoring force of the deformed protrusions 24 may contribute to fasten the main-body portion 32 of the coupling bar 30 and the plate-like fin 20 together. Likewise, the other main-body portions 42, 52 and 62 may deform the protrusions 24. Here, the protrusions 24 may dent into the main-body portions of the coupling bars. In a different example, the protrusions 24 of the plate-like fin 20 may come into contact with the main-body portion 32, 42, 52 or 62 of the coupling bar 30, 40, 50 or 60 by pressing the protrusions 24 of the plate-like fin 20 in the +Z direction and the −Z direction.

Figure 6:
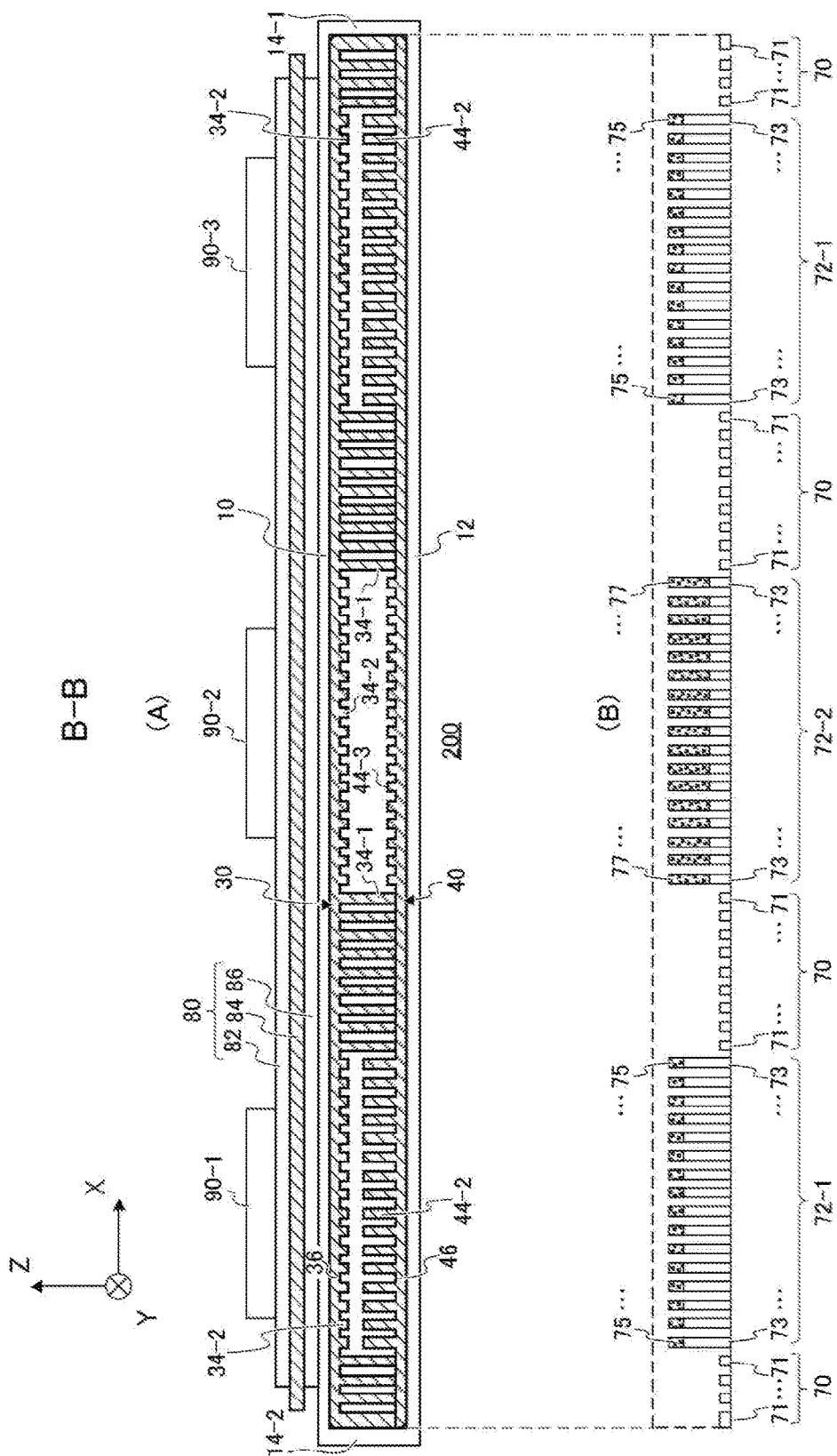
FIG. 6 includes a view (A) showing a cross-section taken along the line B-B in FIG. 2.

FIG. 6 includes a view (A) showing a cross-section taken along the line B-B in FIG. 2. The B-B cross-section is the cross-section of the semiconductor module 200 that is positioned between the coupling bar 30 and the inlet 16 and parallel to the X-Z plane orthogonal to the Y-axis direction. In the present example, the semiconductor module 200 includes the cooler 100, a multilayered substrate 80 and the plurality of semiconductor chips 90. As shown in the view (A) in FIG. 6, the cooler 100 has the lower plate 12. The upper plate 10, the lower plate 12, and the four or front, back, left and right side plates 14 may constitute a case housing therein the plate-like fins 20. In the view (A) in FIG. 6, the coupling bar 30 is positioned in front of the coupling bar 40.

Although the plate-like fins 20 are not shown in the B-B cross-section, each of the depressions 36 of the coupling bar 30 may mesh the upper portion of a corresponding one of the plate-like fins 20. In addition, each of the depressions 46 of the coupling bar 40 may mesh the lower portion of a corresponding one of the plate-like fins 20. Furthermore, a portion of the plate-like fin 20 that mesh neither the depression 36 nor depression 46 and extends in the Y-axis direction may span in the Z-axis direction between the upper plate 10 and the lower plate 12.

The upper plate 10, the lower plate 12 and the side plates 14, the coupling bars 30, 40, 50 and 60, and the plate-like fins 20 may be made of copper (Cu), aluminum (Al) or magnesium (Mg), or a combination of one of copper (Cu), aluminum (Al) and magnesium (Mg) and nickel (Ni) plating thereon. Since the cooler 100 is made of a metal such as copper or aluminum, which exhibits relatively high thermal conductivity, the thermal exchange can be enhanced between the cooling water and the upper plate 10 and the plate-like fins 20, when compared with the case where the cooler 100 is made of an insulating material or the like, which exhibits relatively low thermal conductivity. The above-mentioned copper may include an alloy that is principally made of copper, the above-mentioned aluminum may include an alloy that is principally made of aluminum or the above-mentioned nickel may include an alloy that is principally made of nickel.

The lower portion of the multilayered substrate 80 may be in contact with the upper plate 10, and the upper portion of the multilayered substrate 80 may be in contact with the semiconductor chips 90. The multilayered substrate 80 may include a first metal interconnection layer 82, an insulating layer 84 and a second metal interconnection layer 86. The insulating layer 84 may be sandwiched in the Z-axis direction between the first metal interconnection layer 82 and the second metal interconnection layer 86. The first metal interconnection layer 82 and the second metal interconnection layer 86 may have a shorter length in the X- and Y-axis directions than the insulating layer 84.

On the first metal interconnection layer 82, the semiconductor chips 90 may be provided. The first metal interconnection layer 82 may include interconnections that electrically connect the semiconductor chips 90. The first metal interconnection layer 82 may be an interconnection layer made of copper (Cu) or aluminum (Al).

The insulating layer 84 may be an insulating substrate provided between the first metal interconnection layer 82 and the second metal interconnection layer 86. The insulating layer 84 may be made of a sintered ceramic material such as silicon nitride ($SiN_x$), aluminum nitride ($AlN_x$) or aluminum oxide ($Al_2O_3$).

The insulating layer 84 may be capable of reliably providing electrical insulation between the semiconductor chips 90, through which large current flows, and the metal cooler 100. The insulating layer 84 can ensure that the electrical insulation can be maintained between the semiconductor chips 90 and the cooler 100 regardless whether the cooler 100 is entirely made of metals. From the perspective of the cooling efficiency, it is better to use metals to make the entire of the cooler 100 than to use insulating materials to make a part or the entire of the cooler 100. The multilayered substrate 80 may be divided into sections each of which include at least one of the semiconductor chips 90.

FIG. 6 also includes a view (B) showing the first flow channels 70 and the second flow channels 72 in the B-B cross-section. As shown in the view (B) in FIG. 6, the cooler 100 of the present example includes a plurality of first flow channels 70 and a plurality of second flow channels 72. Each second flow channel 72 may include either large through holes 77 or small through holes 75. In the present example, the second flow channels 72-1 include the small through holes 75. The small through holes 75 may include the overlap in the Y-axis direction between the second openings 73 and the fourth openings 78-1. On the other hand, the second flow channel 72-2 includes the large through holes 77. The large through holes 77 may include the overlap in the -Y-axis direction between the second openings 73 and the fourth openings 78-2, which have a larger opening area than the fourth openings 78-1.

The large through holes 77 may be formed (defined) in the second flow channel 72-2 positioned below the semiconductor chip 90-2 by the gap between the pair of plate-like fins 20 that are next to each other in the X-axis direction and by the gap in the Z-axis direction between the comb-tooth portion 34-2 and the comb-tooth portion 44-3. On the other hand, the small through holes 75 may be formed (defined) in the second flow channels 72-1 by the gap between the pair of plate-like fins 20 that are next to each other in the X-axis direction and by the gap in the Z-axis direction between the comb-tooth portion 34-2 and the comb-tooth portion 44-2.

As has been described with reference to FIG. 3B, the protruding length of the comb-tooth portions 44-2 in the second flow channels 72-1, in which the small through holes 75 are formed, is larger than the protruding length of the comb-tooth portions 44-3 in the second flow channel 72-2, in which the large through holes 77 are formed. On the other hand, the protruding length of the comb-tooth portions 34-2 is the same in either the second flow channels 72-1 or second flow channel 72-2. Accordingly, when seen in the extending direction 25 (Y-axis direction), the large through holes 77 have a larger opening area than the small through holes 75. Furthermore, the small through holes 75 are provided in the second flow channels 72-1, which are closer to the inlet 16 or outlet 18 than the large through holes 77 are. In this manner, the present embodiment can reduce the imbalance in the flow rate of the cooling water among the second flow channels 72-1 and 72-2. The sum of the opening areas of the large through holes 77 in the second flow channel 72-2 is larger than the sum of the opening areas of the small through holes 75 in either one of the second flow channels 72-1. The number of the pairs of the comb-tooth portion 34 and the comb-tooth portion 44 may be the same or different between the second flow channels 72-1 and the second flow channel 72-2.

In the present example, the term "through hole" means that a continuous opening is formed in the Y-axis direction between a first coupling bar (for example, the coupling bar 30) and a second coupling bar that is in the vicinity of the first coupling bar (for example, the coupling bar 40). The through hole may further extend from the two coupling bars that are in the vicinity of each other. The through hole may include a continuous opening formed from the coupling bar 30 to the coupling bar 50.

Figure 7:
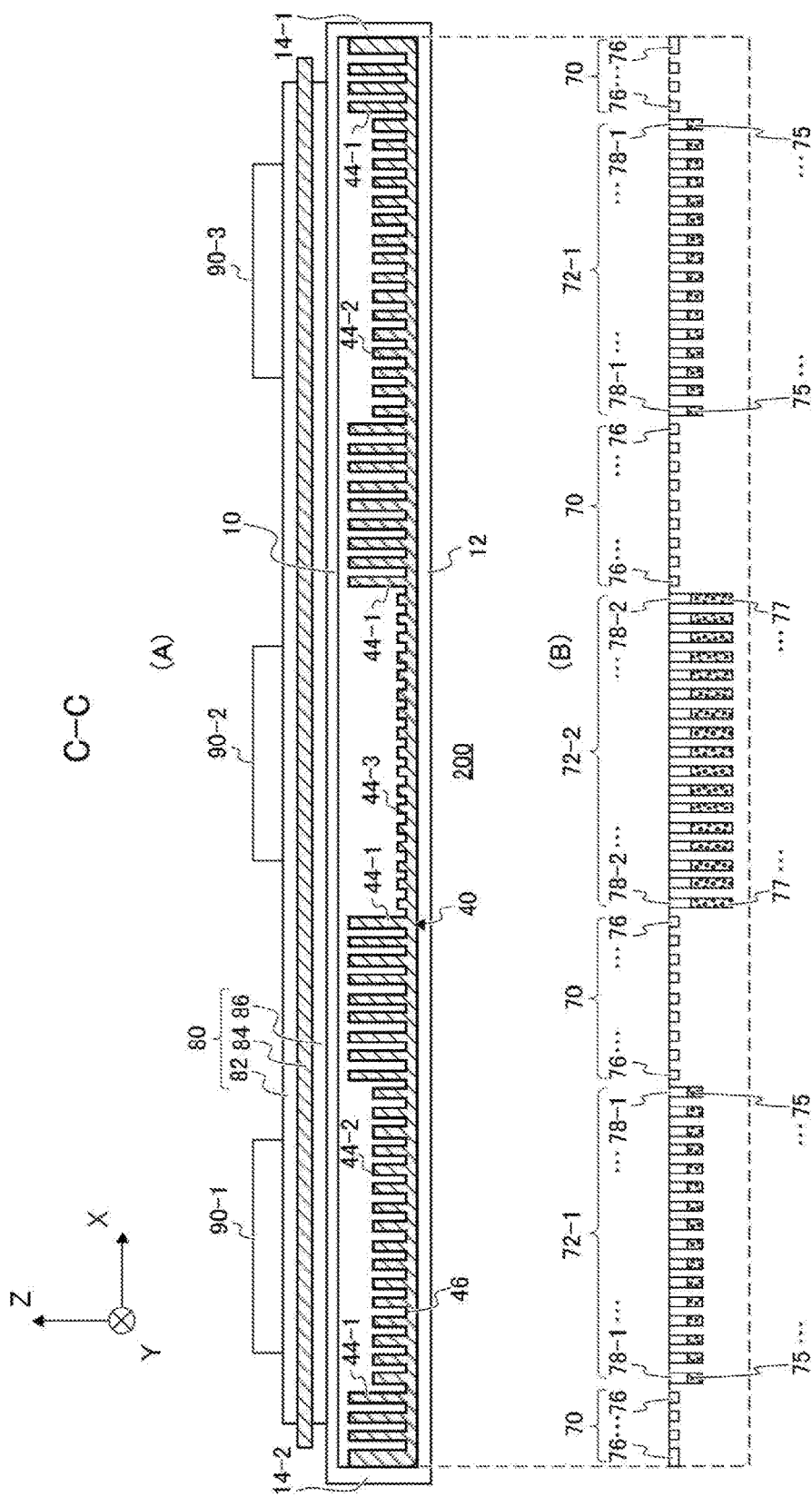
FIG. 7 includes a view (A) showing a cross-section taken along the line C-C in FIG. 2.

FIG. 7 includes a view (A) showing a cross-section taken along the line C-C in FIG. 2. The C-C cross-section is the cross-section of the semiconductor module 200 that is positioned between the coupling bar 30 and the coupling bar 40 in the extending direction 25 and parallel to the X-Z plane orthogonal to the Y-axis direction. FIG. 7 (A) only shows, in the C-C cross-section, the coupling bar 40 and the plate-like fins 20 in the internal space enclosed within the upper plate 10, the lower plate 12 and the side plates 14.

FIG. 7 also includes a view (B) showing the first flow channels 70 and the second flow channels 72 in the C-C cross-section. As in the B-B cross-section, the cooler 100 includes in the X-Z plane the first openings 76 provided in the first flow channels 70 and the second openings 78, which are larger than the first openings 76, provided in the second flow channels 72. The second flow channel 72-2 has the large through holes 77, and the second flow channels 72-1 have the small through holes 75.

Figure 8:
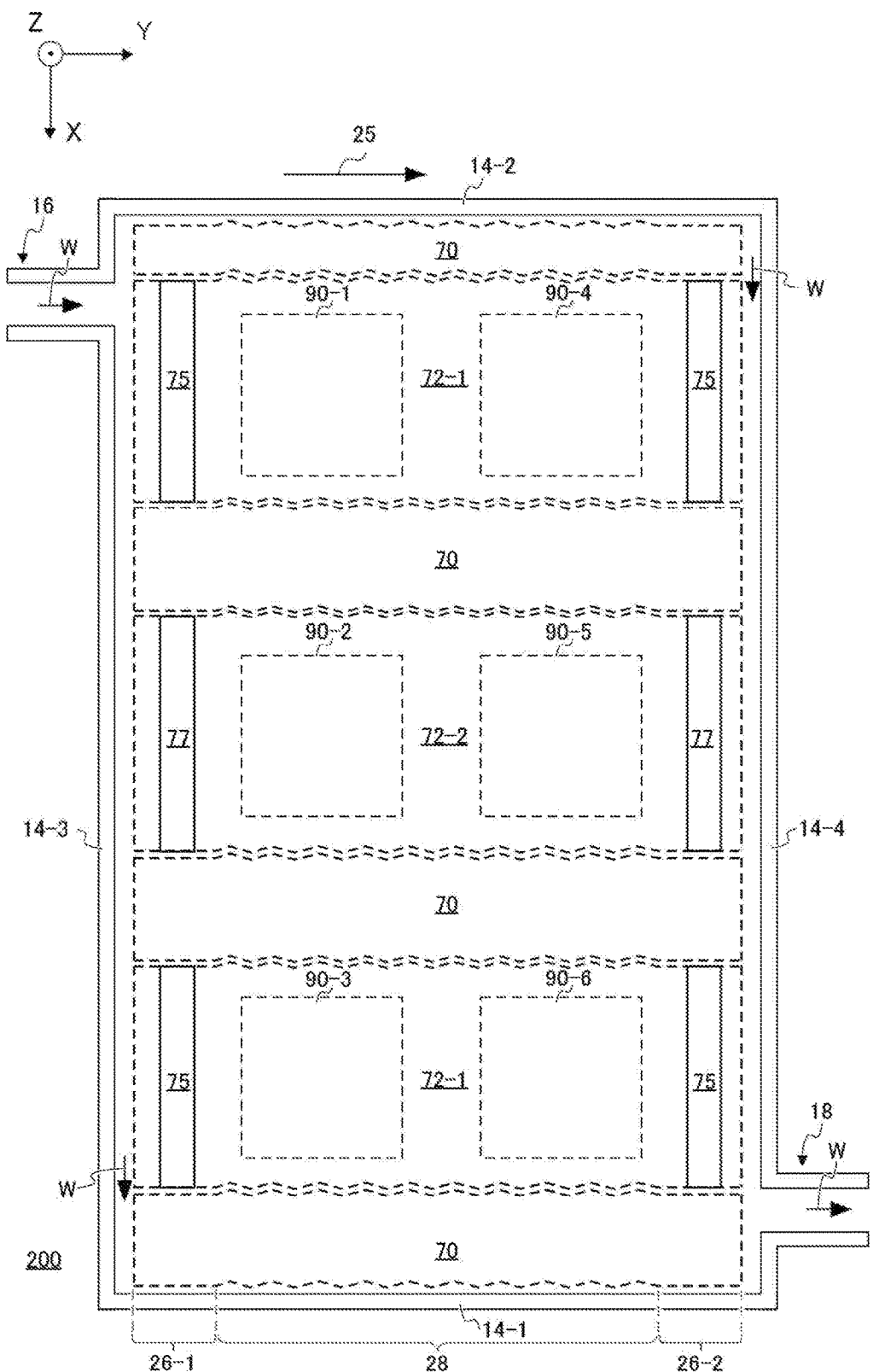
FIG. 8 shows how an inlet 16 and an outlet 18 are positioned relative to through holes.

FIG. 8 shows how the inlet 16 and the outlet 18 are positioned relative to the through holes. FIG. 8 corresponds to FIG. 2 and is a top view showing the cooler 100. In FIG. 8, however, for the purpose of better understanding of how the through holes are positioned in the second flow channels 72, the small through holes 75 and the large through holes 77 are indicated by the solid lines and the first flow channels 70, the second flow channels 72 and the semiconductor chips 90 are indicated by the dotted lines. It also should be noted that FIG. 8 does not show the plate-like fins 20.

In the present example, the coupling bar 50 has the same structure as the coupling bar 30, and the coupling bar 60 has the same structure as the coupling bar 40. Accordingly, the second flow channels 72-1 have the small through holes 75 in the upstream and downstream portions thereof, and the second flow channel 72-2 has the large through holes 77 in the upstream and downstream portions thereof. As described above, the imbalance in the flow rate of the cooling water can be reduced by arranging one of the second flow channels 72-1 at the position closest to the inlet 16, the other of the second flow channels 72-1 at the position closest to the outlet 18, and the second flow channel 72-2 between the two second flow channels 72-1 in the X-axis direction. Note that the cooling water may also flow in the X-axis direction while running through the flow channel extending from the inlet 16 to the outlet 18. For example, part of the cooling water W flows in the X-axis direction in the vicinity of the side plates 14-3 and 14-4.

Figure 9A:
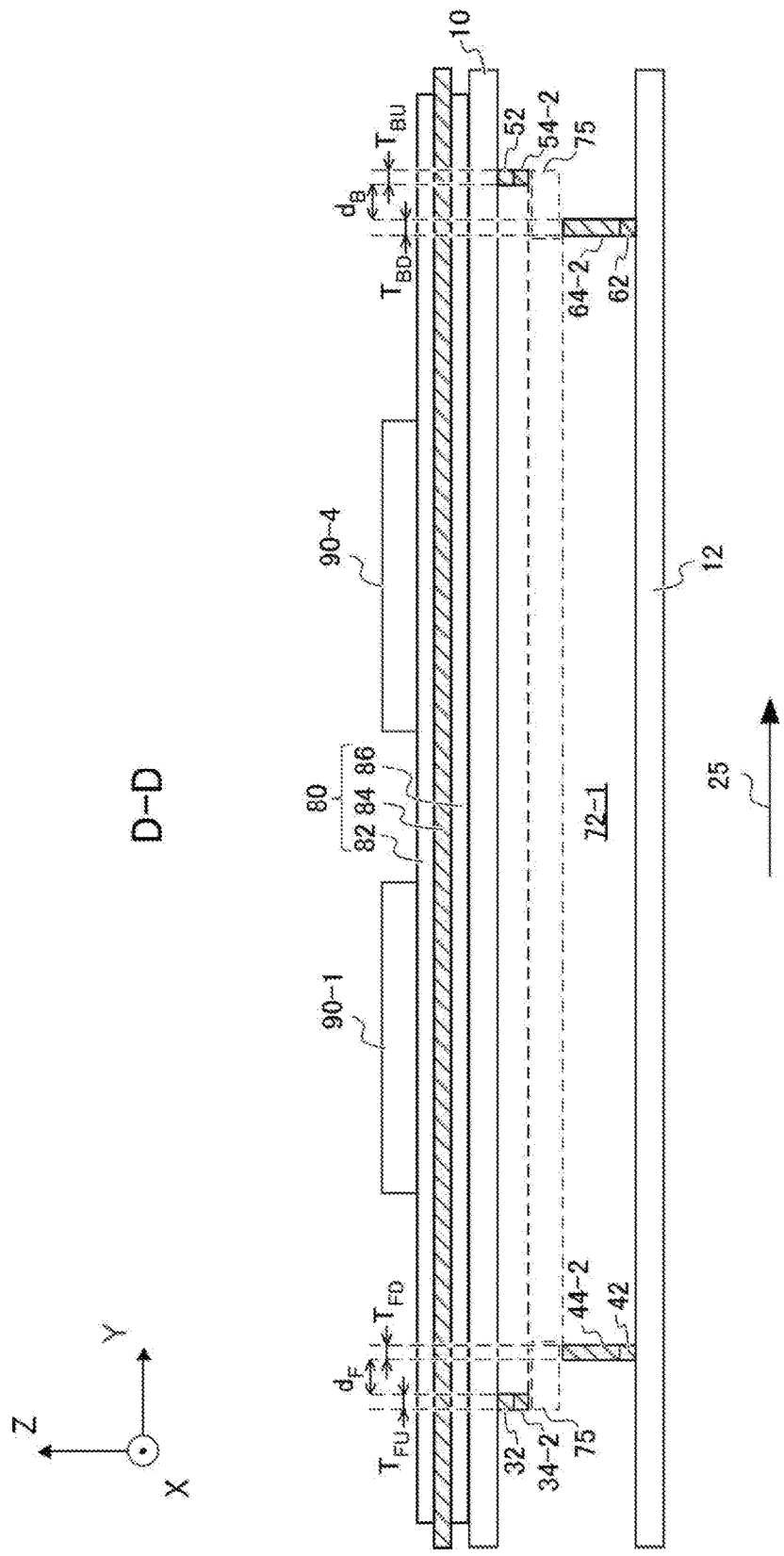
FIG. 9A shows a cross-section taken along the line D-D in FIG. 2.

FIG. 9A shows a cross-section taken along the line D-D in FIG. 2. The D-D cross-section is the cross-section of the semiconductor module 200 along the Y-Z plane that is parallel to the extending direction 25. The D-D cross-section is also the cross-section of the second flow channel 72-1. For better intelligibility, however, the side plates 14 are not shown. In the second flow channel 72-1, the comb-tooth portion 44-2 and the comb-tooth portion 34-2 do not overlap in the extending direction 25, and the coupling bars 30 and 40 thus form the small through hole 75. Likewise, the coupling bars 50 and 60 also form the small through hole 75. In this way, the flow rate can be higher in the second flow channels 72 than in the first flow channels 70, which can contribute to more efficient cooling of the semiconductor chip 90. Here, the comb-tooth portions 54-1 and 54-2 respectively correspond to the comb-tooth portions 34-1 and 34-2. Likewise, the comb-tooth portions 64-1, 64-2 and 64-3 respectively correspond to the comb-tooth portions 44-1, 44-2 and 44-3.

In the present example, the cooler 100 has the coupling bars 30 and 40 in the upstream portion and the coupling bars 50 and 60 in the downstream portion. The coupling bars 30, 40, 50 and 60 respectively have Y-axis thicknesses $T_{FU}$, $T_{FD}$, $T_{BU}$ and $T_{BD}$. The coupling bar 50 has the main-body portion 52 and the comb-tooth portions 54-2, and the coupling bar 60 has the main-body portion 62 and the comb-tooth portions 64-2. Here, in the extending direction 25 of the D-D cross-section, the coupling bars have the same thickness as the comb-tooth portions of the coupling bars. Here, $d_F$ denotes the distance between the coupling bar 30 and the coupling bar 40 in the extending direction 25, and $d_B$ denotes the distance between the coupling bar 50 and the coupling bar 60 in the extending direction 25.

The distance d between the two coupling bars in the extending direction 25 may be equal to or larger than the thickness T of the main-body portion of the two coupling bars in the extending direction 25. In the present example, $T_{FU}$ and $T_{FD} \leq d_F$ and $T_{BU}$ and $T_{BD} \leq d_B$. The above-described configurations can prevent a case where the wax material drips off the main-body portion 32 and couples the comb-tooth portion 34-2 and the comb-tooth portion 44-2 together to narrow the second flow channel 72-1.

FIG. 9B shows a cross-section taken along the line E-E in FIG. 2. The E-E cross-section is the cross-section of the semiconductor module 200 along the Y-Z plane that is parallel to the extending direction 25. The E-E cross-section is also the cross-section of the first flow channel 70. For better intelligibility, however, the side plates 14 are not shown. In the first flow channel 70, the comb-tooth portion 44-1 and the comb-tooth portion 34-1 at least partly overlap each other in the extending direction 25. In this manner, the flow rate of the cooling water can be more limited in the first flow channel 70, which does not run below the semiconductor chips 90, than in the second flow channel 72.

FIG. 9C shows a cross-section taken along the line F-F in FIG. 2. The F-F cross-section is the cross-section of the semiconductor module 200 along the Y-Z plane that is parallel to the extending direction 25. The F-F cross-section is also the cross-section of the second flow channel 72-2. For better intelligibility, however, the side plates 14 are not shown. In the second flow channel 72-2, the comb-tooth portion 44-3 and the comb-tooth portion 34-2 do not overlap in the extending direction 25, and the coupling bars 30 and 40 thus form the large through hole 77. Likewise, the coupling bars 50 and 60 also form the large through hole 77. In this way, the flow rate can be higher in the second flow channels 72 than in the first flow channels 70, and, furthermore, the imbalance in the flow rate among the second flow channels 72 can be reduced.

Figure 10:
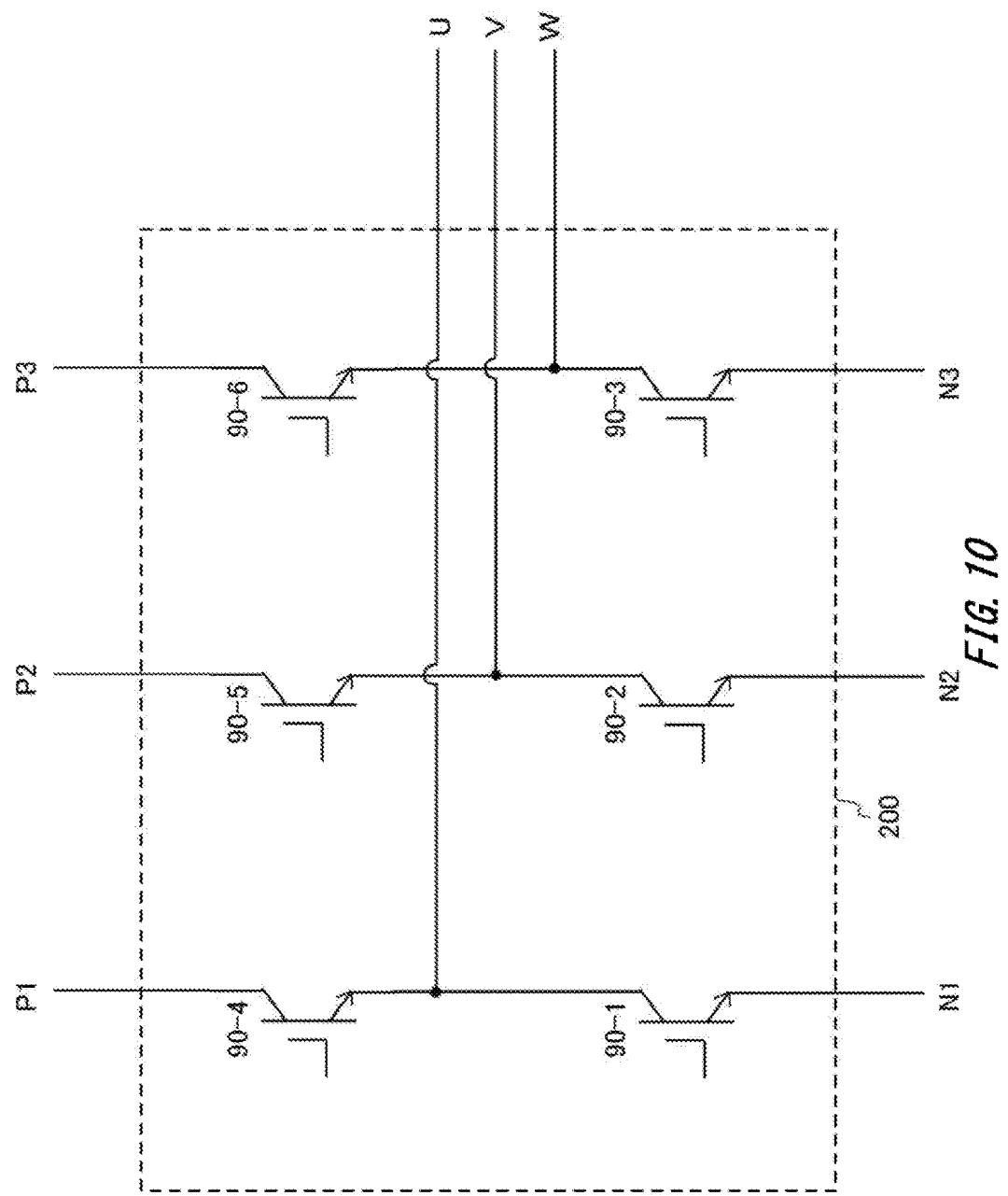
FIG. 10 is a circuit diagram of the semiconductor module 200.

FIG. 10 is a circuit diagram of the semiconductor module 200. The semiconductor module 200 may constitute a part of an in-vehicle power module designed to drive the motor of a vehicle. In the semiconductor module 200, the semiconductor chips 90-1 to 90-6 may be each an RC-IGBT semiconductor chip. In the RC-IGBT semiconductor chip, an insulated gate bipolar transistor (IGBT) and a freewheel diode (FWD) are integrally formed, and the IGBT and the FWD may be connected in inverse parallel. Note that FIG. 10 does not show the signs representative of the FWDs, but each semiconductor chip 90 may include a FWD.

In the semiconductor chip 90-1, the emitter electrode may be electrically connected to an input terminal N1 and the collector electrode may be electrically connected to an output terminal U. In the semiconductor chip 90-2, the emitter electrode may be electrically connected to an input terminal N2 and the collector electrode may be electrically connected to an output terminal V. In the semiconductor chip 90-3, the emitter electrode may be electrically connected to an input terminal N3 and the collector electrode may be electrically connected to an output terminal W. In the semiconductor chip 90-4, the emitter electrode may be electrically connected to an output terminal U and the collector electrode may be electrically connected to an input terminal P1. In the semiconductor chip 90-5, the emitter electrode may be electrically connected to an output terminal V and the collector electrode may be electrically connected to an input terminal P2. In the semiconductor chip 90-6, the emitter electrode may be electrically connected to an output terminal W and the collector electrode may be electrically connected to an input terminal P3.

The semiconductor chips 90-1 to 90-6 may be alternately switched on and off by the signal input into the control electrode pad of the semiconductor chips 90. In the present example, each semiconductor chip 90 is an RC-IGBT. Accordingly, when each semiconductor chip 90 is switched on, the IGBT region may generate heat. In addition, when each semiconductor chip 90 is switched off, the FWD region may generate heat. The input terminal P1 may be connected to the positive side of an external power source, the input terminal N1 may be connected to the negative side of the external power source, and the output terminal U may be connected to a load. The semiconductor chips 90-1, 90-2 and 90-3 may constitute a lower arm of the semiconductor module 200, and the semiconductor chips 90-4, 90-5 and 90-6 may constitute an upper arm of the semiconductor module 200.

The input terminals P1, P2 and P3 may be electrically connected to each other, and the other input terminals N1, N2 and N3 may be also electrically connected to each other. The semiconductor module 200 of the present example may serve as a three-phase AC inverter circuit having the output terminals U, V and W.

Figure 11:
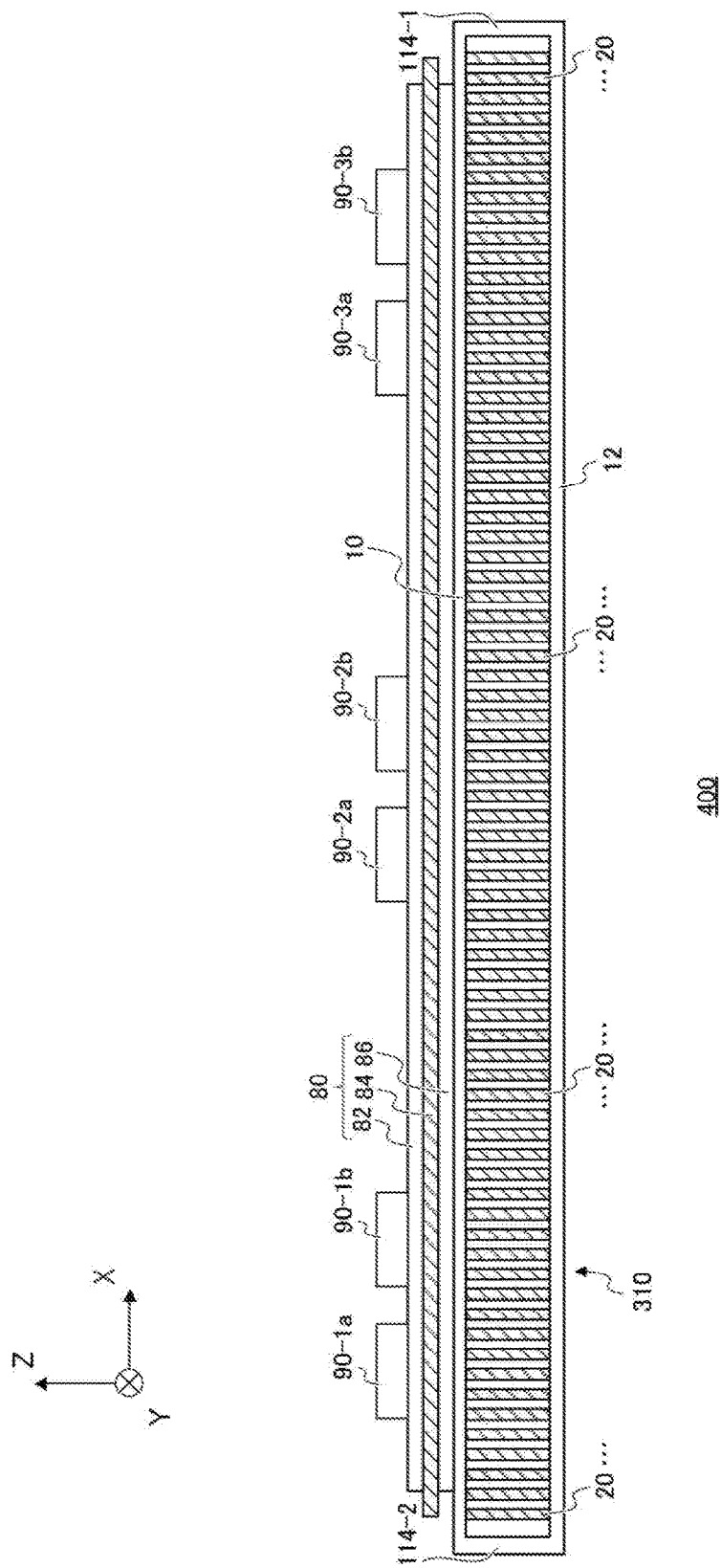
FIG. 11 shows a cross-section of a semiconductor module 400 relating to a comparative example

FIG. 11 shows a cross-section of a semiconductor module 400 relating to a comparative example. The semiconductor module 400 includes a cooler 310, a multilayered substrate 80 and a plurality of semiconductor chips 90. The multilayered substrate 80 and the semiconductor chips 90 may be configured in the same manner as in the first embodiment. The cooler 310 of the comparative example is different from the cooler 100 of the first embodiment in terms of that the coupling bars 30, 40, 50 and 60 are not provided. The semiconductor module 400 is similar to a semiconductor module 300, which will be described later, in that an inlet 116, an outlet 118, side plates 114 and semiconductor chips 90-1a to 90-6b are arranged so that the main circuit is constituted.

Figure 12A:
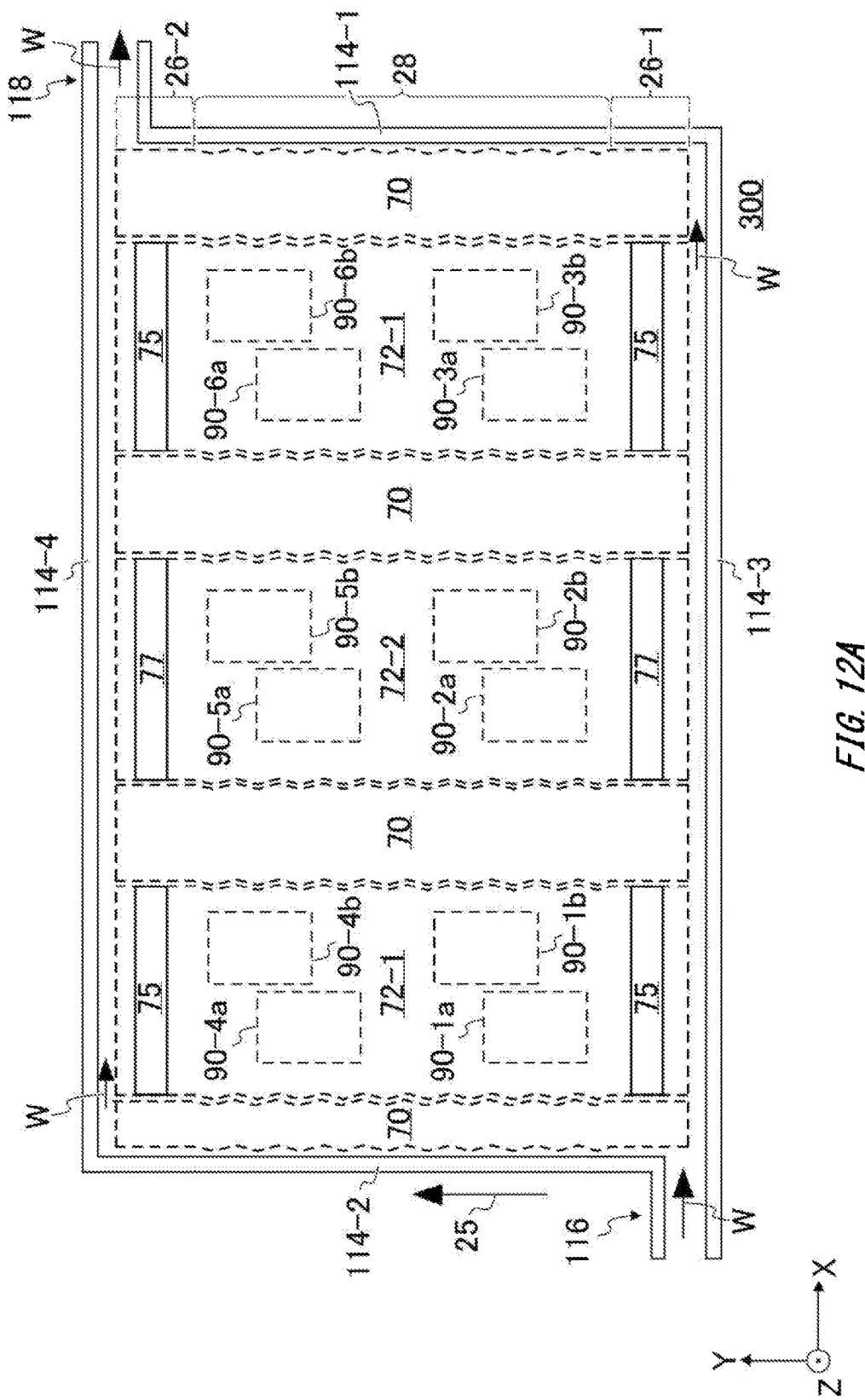
FIG. 12A is a top view showing a semiconductor module 300 including the cooler 100, for which thermal resistance simulation was conducted.

FIG. 12A is a top view showing a semiconductor module 300 including the cooler 100, for which thermal resistance simulation was conducted. FIG. 12A shows how semiconductor chips 90, an inlet 116, an outlet 118, small through holes 75 and large through hole 77 are positioned relative to each other. In the semiconductor module 300, the inlet 116 is provided in the side plate 114-2, and the outlet 118 is provided in the side plate 114-1. The inlet 116 and the outlet 118 extend in parallel to the direction in which the coupling bars 30, 40, 50 and 60 extend (in the X-axis direction). Note that the inlet 116 and the outlet 118 may extend orthogonally to the extending direction 25 of the plate-like fins 20 (in the X-axis direction) as shown in FIG. 12A, or, in a different example, extend in parallel to the extending direction 25 (in the Y-axis direction), like the inlet 16 and the outlet 18 of FIG. 8. The inlet 116 preferably extends in parallel to the direction orthogonal to the extending direction 25 of the plate-like fins 20 (in the X-axis direction) as shown in the example of FIG. 12A, since this arrangement can reduce the variation in the quantity of the cooling water among the respective second flow channels 72. The cooling water W fed through the inlet 116 may at least partly flow in the X-axis direction along the coupling bars 30 and 50 in the vicinity of the side plates 114-3 and 114-4.

Figure 12B:
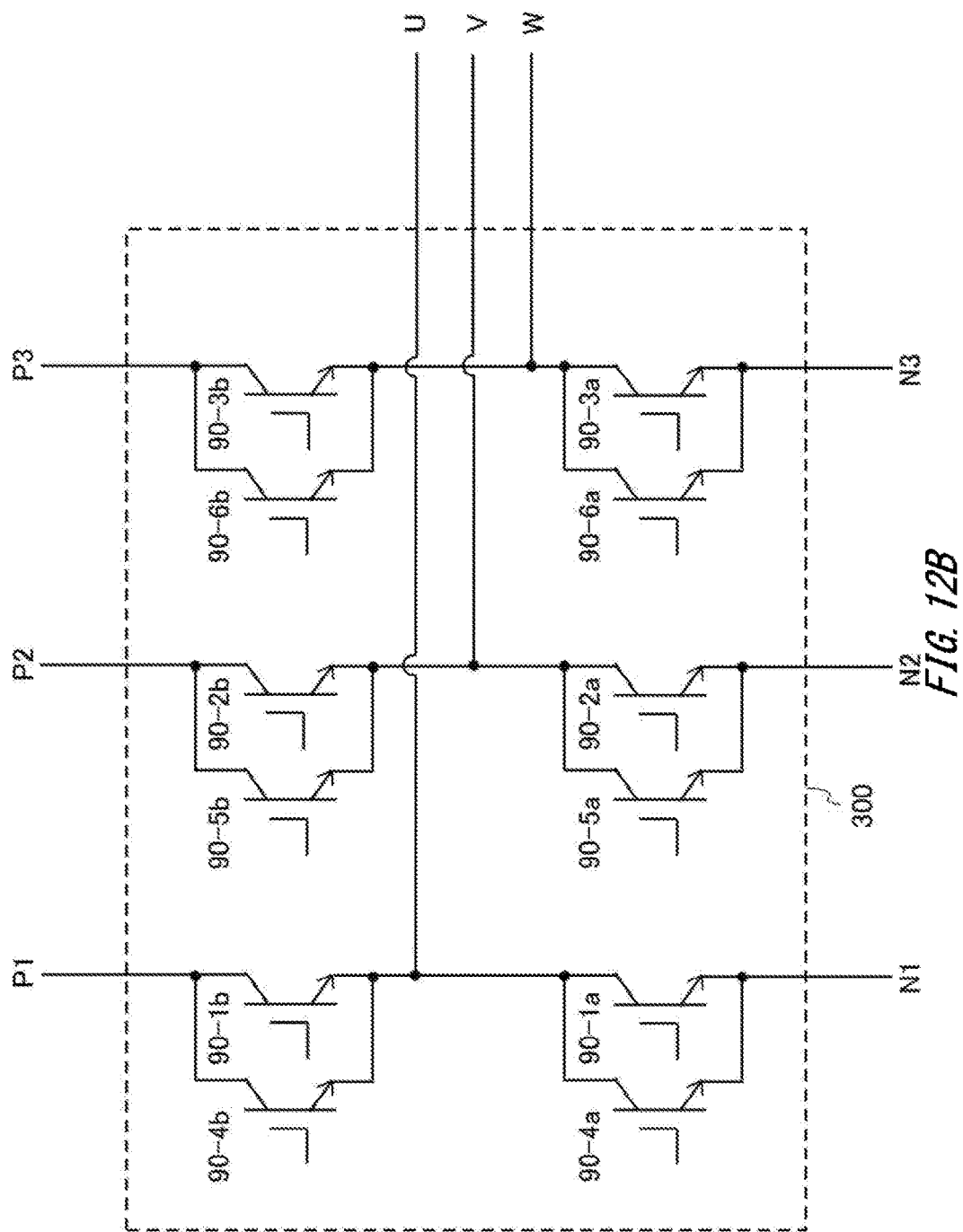
FIG. 12B is a circuit diagram corresponding to FIG. 12A.

FIG. 12B is a circuit diagram corresponding to FIG. 12A. When this thermal resistance simulation was conducted, two semiconductor chips 90 were provided in parallel with each other in each arm. The two chips in each arm were arranged next to each other in the extending direction 25. In the present example, the semiconductor chips 90-4a and 90-1a constitute the lower arm corresponding to the output terminal U, and the semiconductor chips 90-4b and 90-1b constitute the upper arm corresponding to the output terminal U. Likewise, in the present example, the semiconductor chips 90-5a and 90-2a constitute the lower arm corresponding to the output terminal V, and the semiconductor chips 90-5b and 90-2b constitute the upper arm corresponding to the output terminal V. Also, in the present example, the semiconductor chips 90-6a and 90-3a constitute the lower arm corresponding to the output terminal W, and the semiconductor chips 90-6b and 90-3b constitute the upper arm corresponding to the output terminal W.

Figure 12C:
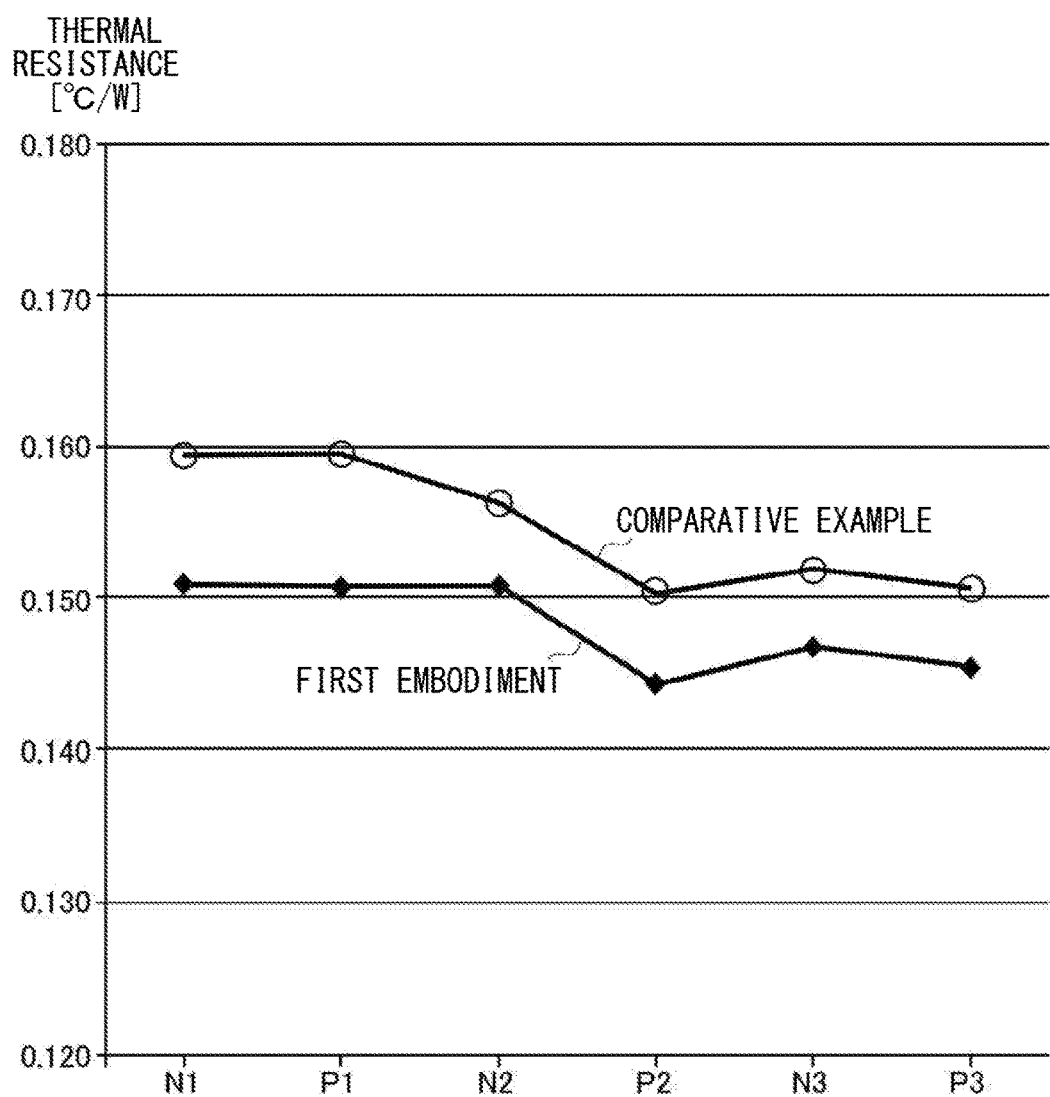
FIG. 12C shows the results of the thermal resistance simulations conducted for the example shown in FIGS. 12A and 12B and a comparative example in which the cooler shown in FIG. 12A is replaced with a cooler 310 shown in FIG. 11.

FIG. 12C shows the results of the thermal resistance simulations conducted for the example shown in FIGS. 12A and 12B and the comparative example in which the cooler shown in FIG. 12A is replaced with the cooler 310 shown in FIG. 11. The horizontal axis represents the portion the thermal resistance of which was evaluated by the simulations. The present simulations were conducted to evaluate the thermal resistance of the central portion of the X-Y plane in the semiconductor chips 90-4a, 90-4b, 90-5a, 90-5b, 90-6a and 90-6b connected to the terminals N1, P1, N2, P2, N3 and P3 shown in FIG. 12B. The vertical axis represents the thermal resistance $R_{th}$ [° C./W]. Note that the thermal resistance $R_{th}$ may be defined based on $\Delta T[° C.]=R_{th}[° C./W] \times P_{LOSS}[W]$. Here, $\Delta T[° C.]$ denotes the difference in temperature between the semiconductor chip 90 and the upper plate 10, and $P_{LOSS}$ [W] denotes the energy loss in each semiconductor chip 90.

As is clearly indicated by the results shown in FIG. 12C, each semiconductor chip exhibited lowered thermal resistance $R_{th}$ in the first embodiment when compared with the comparative example. In addition, the variation in the thermal resistance $R_{th}$ was smaller in the first embodiment when compared with the comparative example These results prove that the first embodiment can improve the cooling efficiency of the semiconductor chips 90 by providing the coupling bars 30, 40, 50 and 60 to lower the flow rate of the cooling water in the first flow channels 70 and raise the flow rate of the cooling water in the second flow channels 72.

Figure 13A:
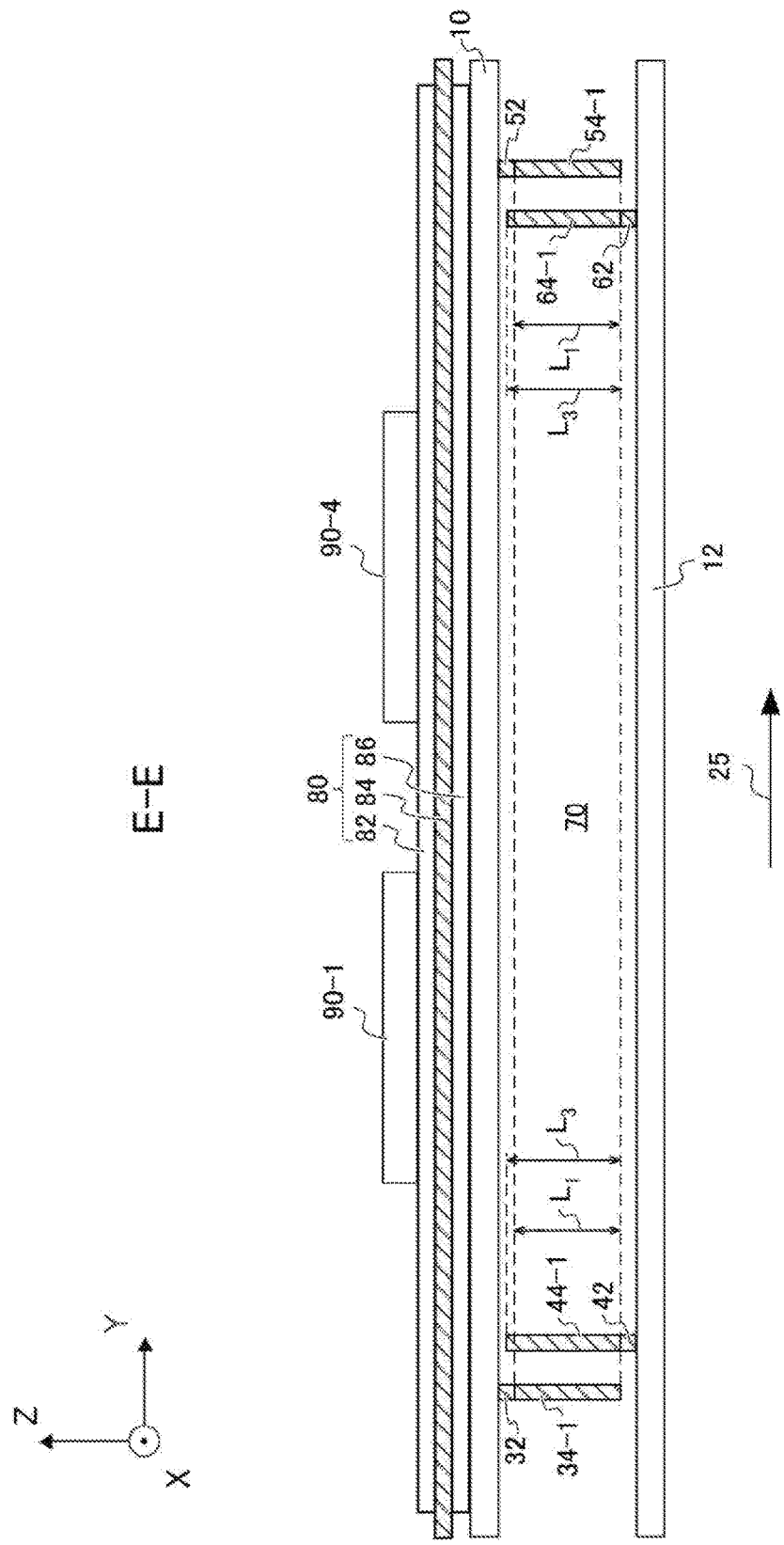
FIG. 13A shows a first modification example in the cross-section taken along the line E-E in FIG. 2.

FIG. 13A shows a first modification example in the cross-section taken along the line E-E in FIG. 2. The E-E cross-section is the cross-section of the first flow channels. In FIG. 13A, the upper end of the comb-tooth portion 44-1 is positioned higher than the lower end of the main-body portion 32 of the coupling bar 30. For example, the distance between the upper end of the comb-tooth portion 44-1 and the upper plate 10 is larger than 0 mm and no more than 1 mm. Here, the lower end of the comb-tooth portion 34-1 is aligned with the upper end of the main-body portion 42 of the coupling bar 40. The distance between the upper end of the comb-tooth portion 44-1 and the upper plate 10 may be adjusted according to the flow rate of the cooling water in the first flow channels 70. In this manner, the flow rate of the cooling water can be reduced in the first flow channels 70 to be lower than in the second flow channels, and the reduction can be also adjusted.

In the present example, the upper end of the comb-tooth portion 64-1 is also positioned higher than the lower end of the main-body portion 52 of the coupling bar 50. For example, the distance between the upper end of the comb-tooth portion 64-1 and the upper plate 10 is also larger than 0 mm and no more than 1 mm. Here, the lower end of the comb-tooth portion 54-1 is also aligned with the upper end of the main-body portion 62 of the coupling bar 60. In this manner, the flow rate of the cooling water in the first flow channels 70 may be adjusted in the upstream and downstream portions.

Figure 13B:
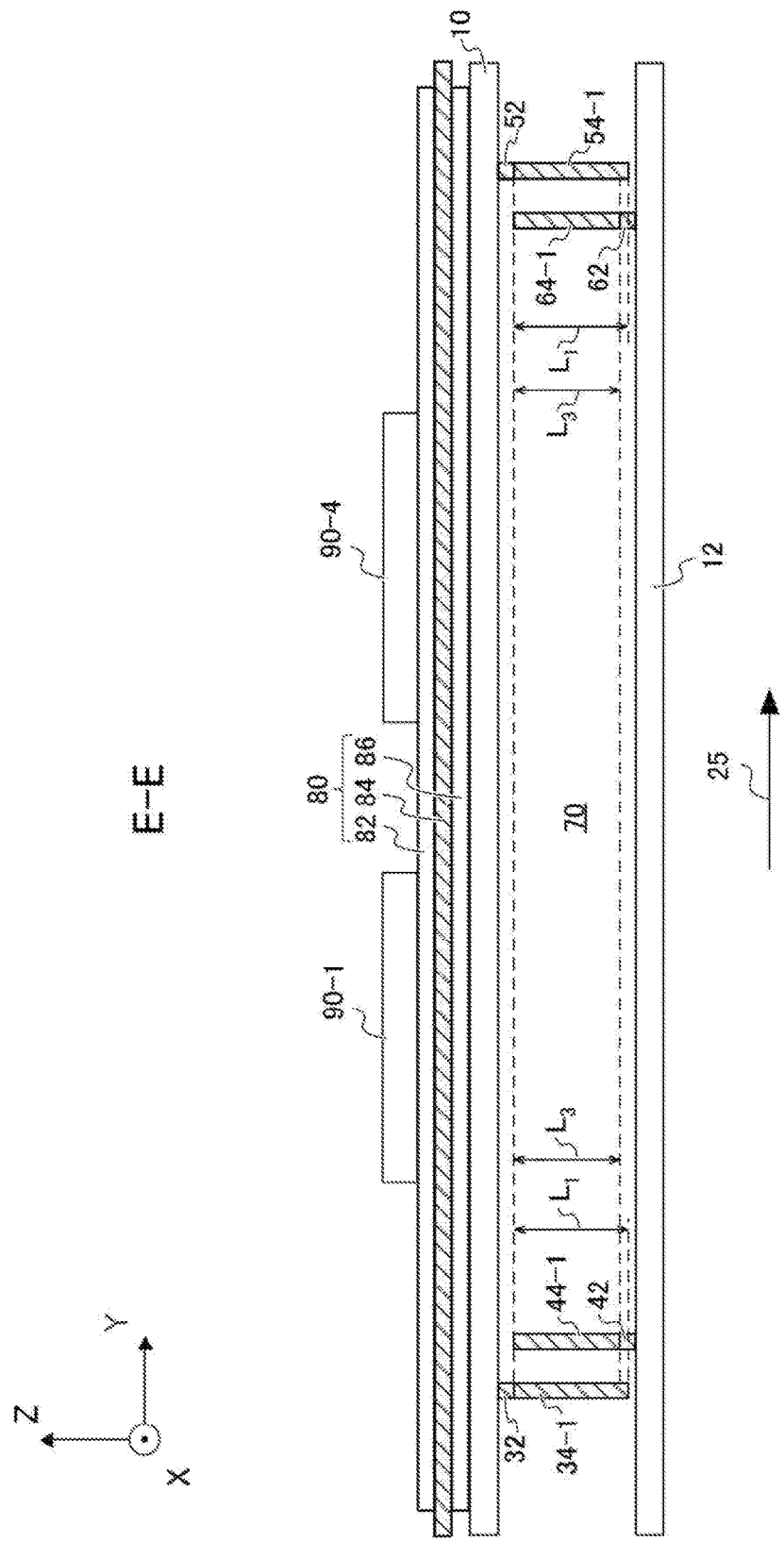
FIG. 13B shows a second modification example in the cross-section taken along the line E-E in FIG. 2.

FIG. 13B shows a second modification example in the cross-section taken along the line E-E in FIG. 2. In FIG. 13B, the lower end of the comb-tooth portion 34-1 is positioned lower than the upper end of the main-body portion 42 of the coupling bar 40. For example, the distance between the lower end of the comb-tooth portion 34-1 and the lower plate 12 is larger than 0 mm and no more than 1 mm. Here, the upper end of the comb-tooth portion 44-1 is aligned with the lower end of the main-body portion 32 of the coupling bar 30. The distance between the lower end of the comb-tooth portion 34-1 and the lower plate 12 may be adjusted according to the flow rate of the cooling water in the first flow channels 70. In this manner, the flow rate of the cooling water can be reduced in the first flow channels 70 to be lower than in the second flow channels, and the reduction can be also adjusted.

In the present example, the lower end of the comb-tooth portion 54-1 is also positioned lower than the upper end of the main-body portion 62 of the coupling bar 60. For example, the distance between the lower end of the comb-tooth portion 54-1 and the lower plate 12 is also larger than 0 mm and no more than 1 mm. Here, the upper end of the comb-tooth portion 64-1 is also aligned with the lower end of the main-body portion 52 of the coupling bar 50. In this manner, the flow rate of the cooling water in the first flow channels 70 may be adjusted in the upstream and downstream portions. Alternatively, the configurations shown in FIG. 13A may be employed in the upstream portion, and the configurations shown in FIG. 13B may be employed in the downstream portion. Alternatively, the configurations shown in FIG. 13A may be employed in the downstream portion, and the configurations shown in FIG. 13B may be employed in the upstream portion.

Figure 14:
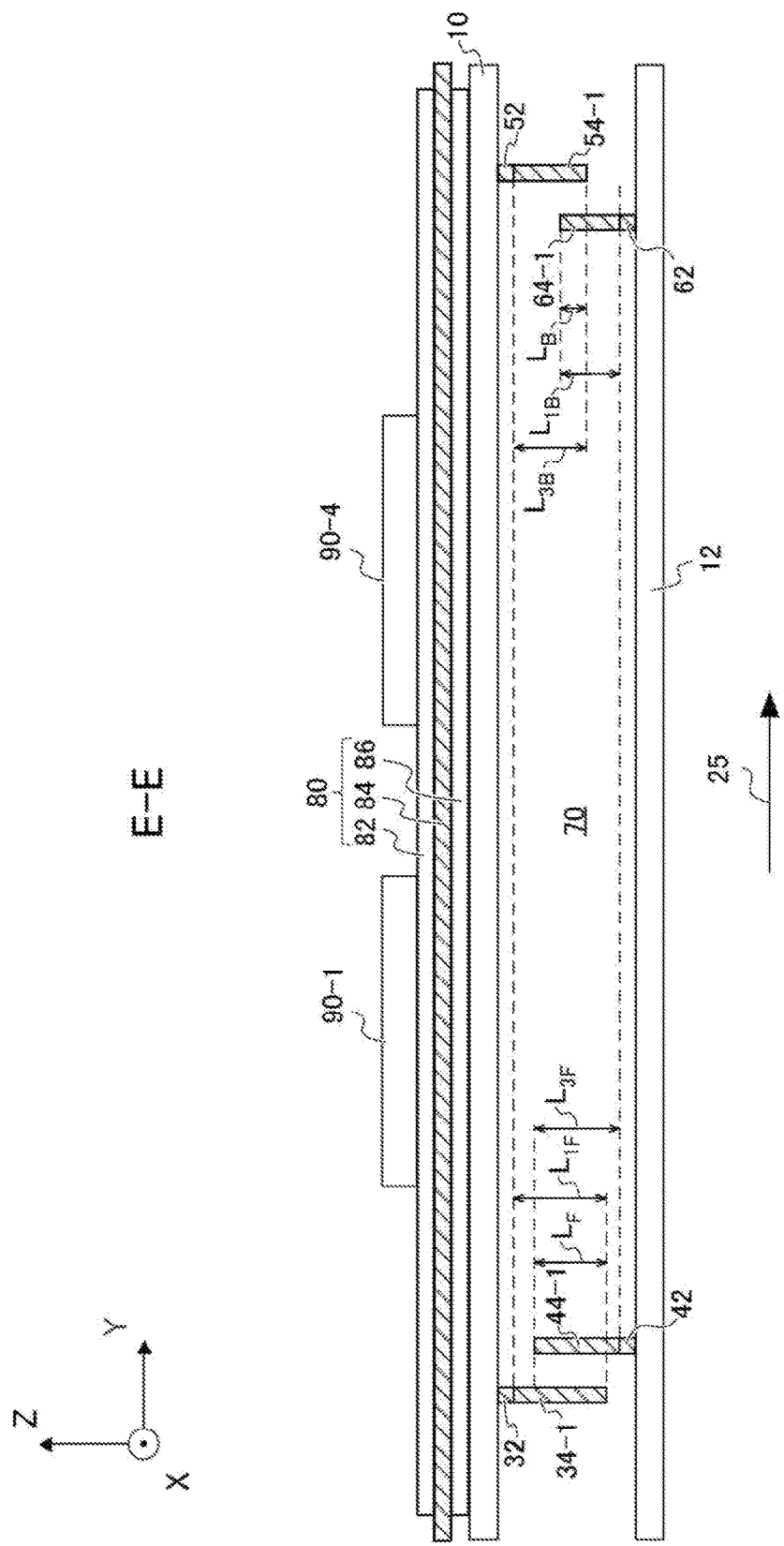
FIG. 14 shows a third modification example in the cross-section taken along the line E-E in FIG. 2.

FIG. 14 shows a third modification example in the cross-section taken along the line E-E in FIG. 2. In the present example, the Z-axis length $L_{1F}$ of the comb-tooth portion 34-1 is larger than the Z-axis length $L_{3B}$ of the comb-tooth portion 54-1. Also, the Z-axis length $L_{3F}$ of the comb-tooth portion 44-1 is larger than the Z-axis length $L_{1B}$ of the comb-tooth portion 64-1. In the first flow channels 70 of the present example, the length $L_F$ of the overlap in the extending direction 25 between the comb-tooth portion 34-1 and the comb-tooth portion 44-1 is larger than the length $L_B$ of the overlap in the extending direction 25 between the comb-tooth portion 54-1 and the comb-tooth portion 64-1. In this manner, the flow of the cooling water can be blocked to an appropriate degree by the coupling bars arranged in the upstream portion where the kinetic energy is higher than in the downstream portion, and the resistance provided by the coupling bars in the downstream portion against the flow of the cooling water can be made lower than in the upstream portion.

Figure 15:
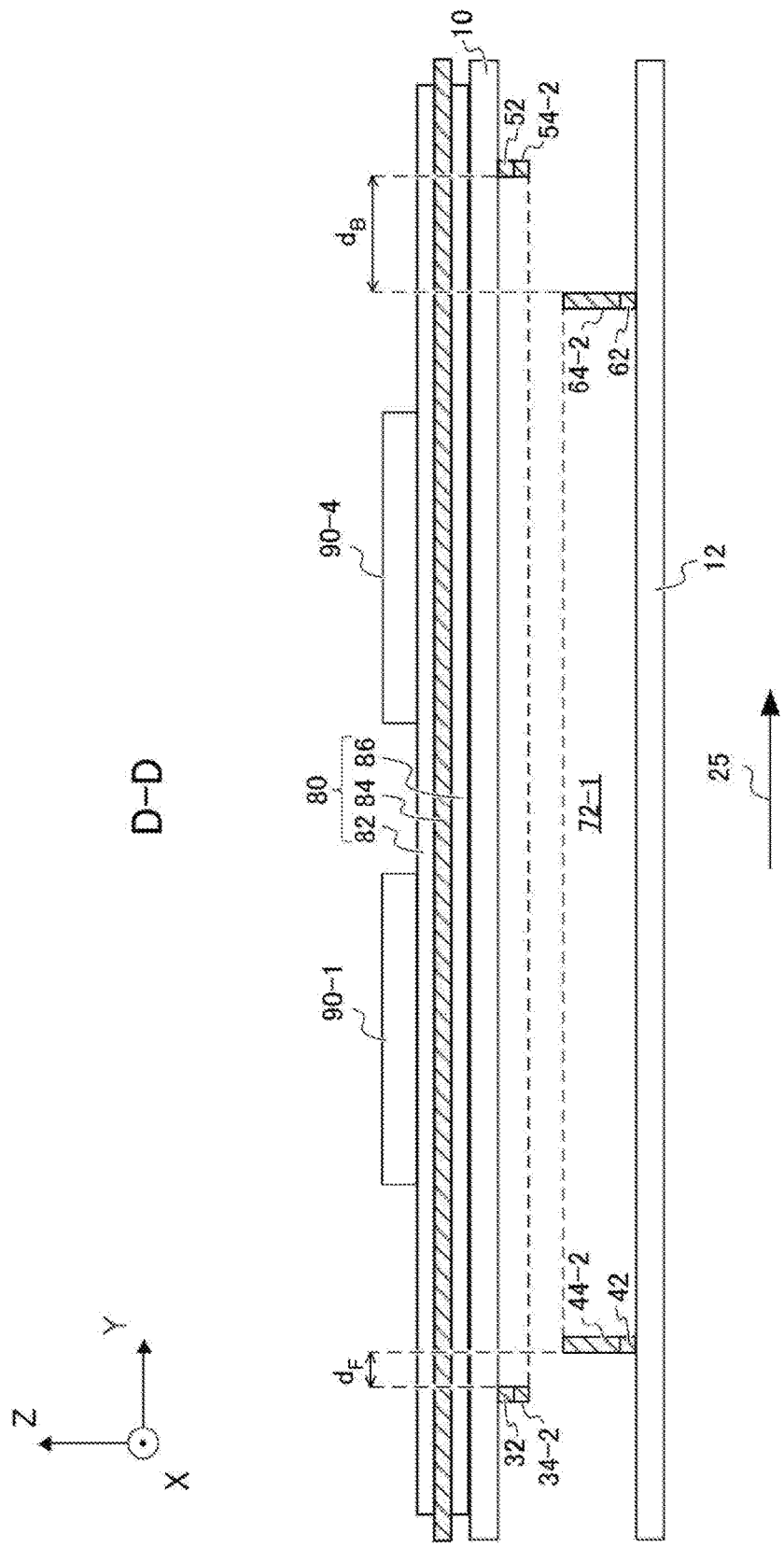
FIG. 15 shows a fourth modification example in the cross-section taken along the line D-D in FIG. 2.

FIG. 15 shows a fourth modification example in the cross-section taken along the line D-D in FIG. 2. In order to facilitate the understanding of the drawings, FIGS. 15 to 17 do not show the through holes. In the present example, the spacing $d_F$ between the coupling bar 30 and the coupling bar 40 is smaller than the spacing $d_B$ between the coupling bar 50 and the coupling bar 60. In this manner, the flow of the cooling water can be blocked to an appropriate degree by the coupling bars arranged in the upstream portion where the kinetic energy is higher than in the downstream portion, and the resistance provided by the coupling bars in the downstream portion against the flow of the cooling water can be made lower than in the upstream portion. Furthermore, the downstream coupling bars 50 and 60 can be assembled more easily since the spacing $d_B$ between the downstream coupling bars is larger than the spacing $d_F$ between the upstream coupling bars. This is also advantageous.

Figure 16:
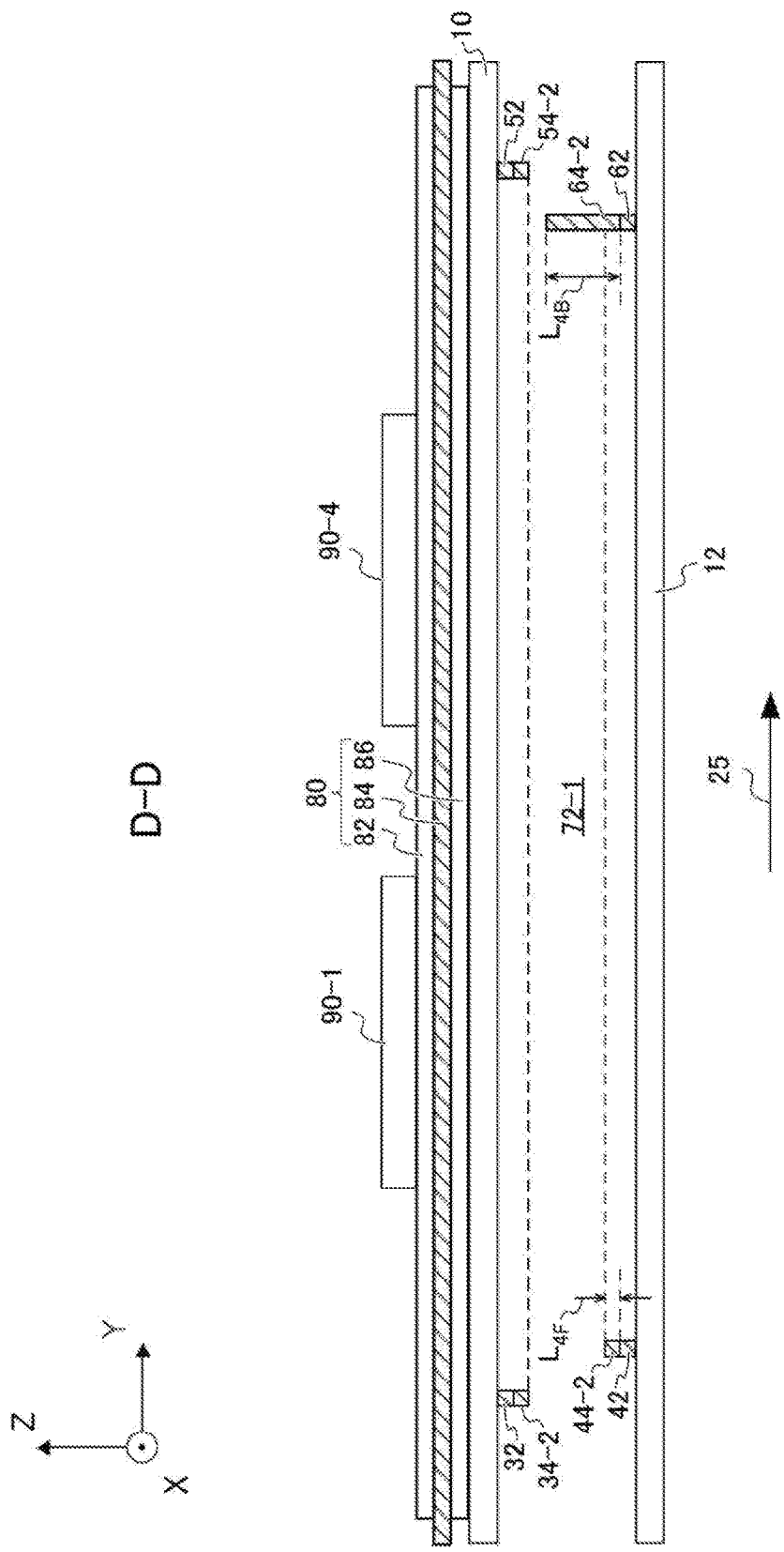
FIG. 16 shows a fifth modification example in the cross-section taken along the line D-D in FIG. 2.

FIG. 16 shows a fifth modification example in the cross-section taken along the line D-D in FIG. 2. In the second flow channels 72 of the present example, the protruding length $L_{4B}$ of the comb-tooth portion 64-2 is larger than the protruding length $L_{4F}$ of the comb-tooth portion 44-2. For example, the protruding length $L_{4B}$ of the comb-tooth portion 64 may be no less than 1.5 times and no more than 5 times, no less than twice and no more than 4 times, or no less than 2.5 times and no more than 3 times as large as the protruding length $L_{4F}$ of the comb-tooth portion 44-2. In this way, in the downstream portion, the flow of the cooling water can be directed toward the upper plate 10. In the present example, the protruding length $L_{2F}$ of the comb-tooth portion 34-2 is the same as the protruding length $L_{2B}$ of the comb-tooth portion 54-2. When compared with the case where the protruding lengths $L_{4B}$ and $L_{4F}$ are the same, the pressure loss can be reduced in the present example while the improved cooling efficiency can be achieved in the downstream portion, where the cooling is more difficult than in the upstream portion.

Figure 17:
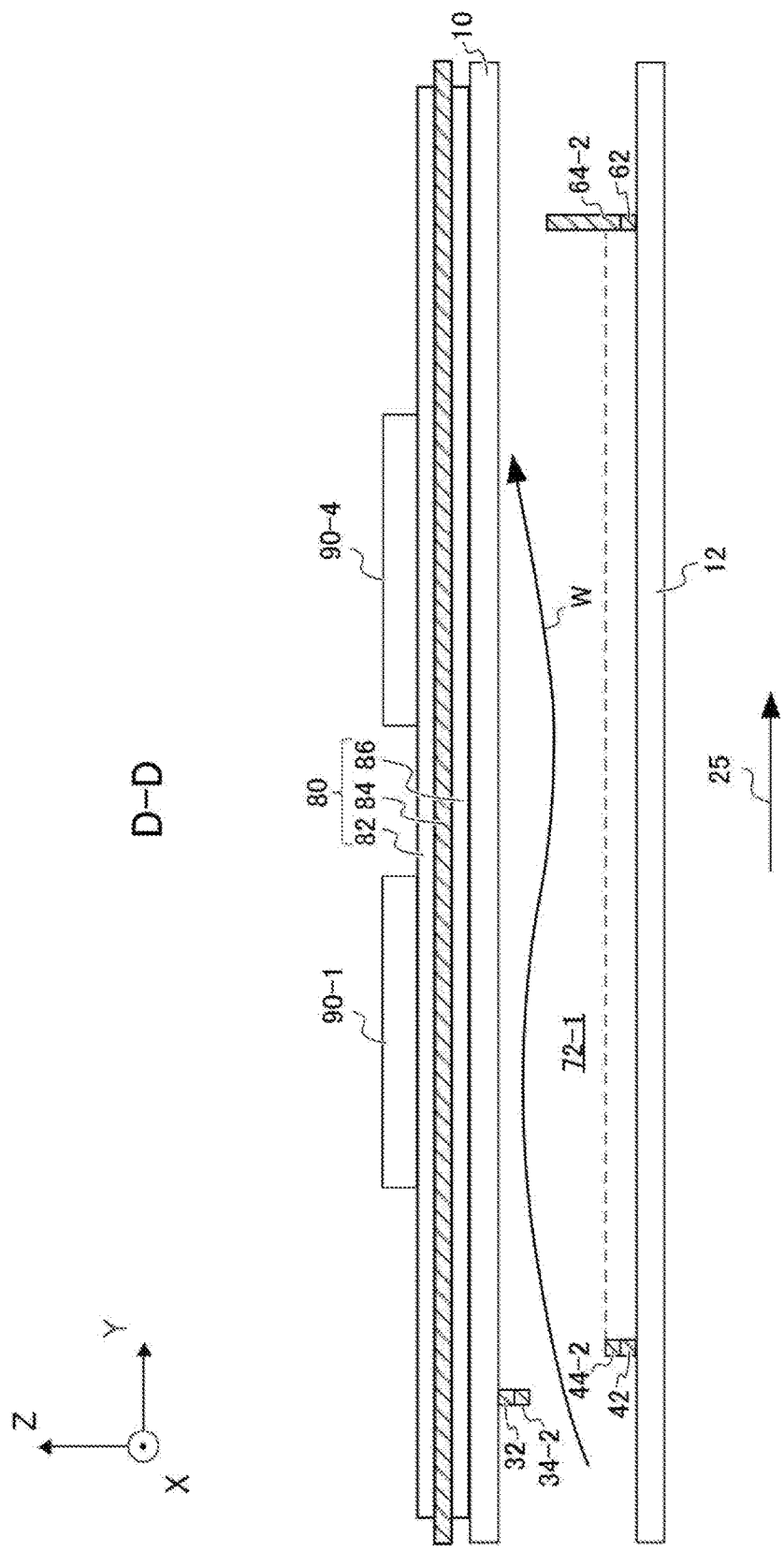
FIG. 17 shows a sixth modification example in the cross-section taken along the line D-D in FIG. 2.

FIG. 17 shows a sixth modification example in the cross-section taken along the line D-D in FIG. 2. In the present example, the cooler 100 has a single downstream coupling bar. In this manner, the pressure loss can be reduced when compared with the exemplary case where the pair of the upper and lower coupling bars is provided in the downstream portion. Note that the cooler 100 of the present example does not have the coupling bar 50 and only has the coupling bar 60. In this manner, the flow of the cooling water can be directed toward the upper plate 10 directly below the semiconductor chips 90-4, 90-5 and 90-6. Accordingly, the improved cooling efficiency can be achieved in the downstream portion, where the cooling is more difficult than in the upstream portion.

Figure 18:
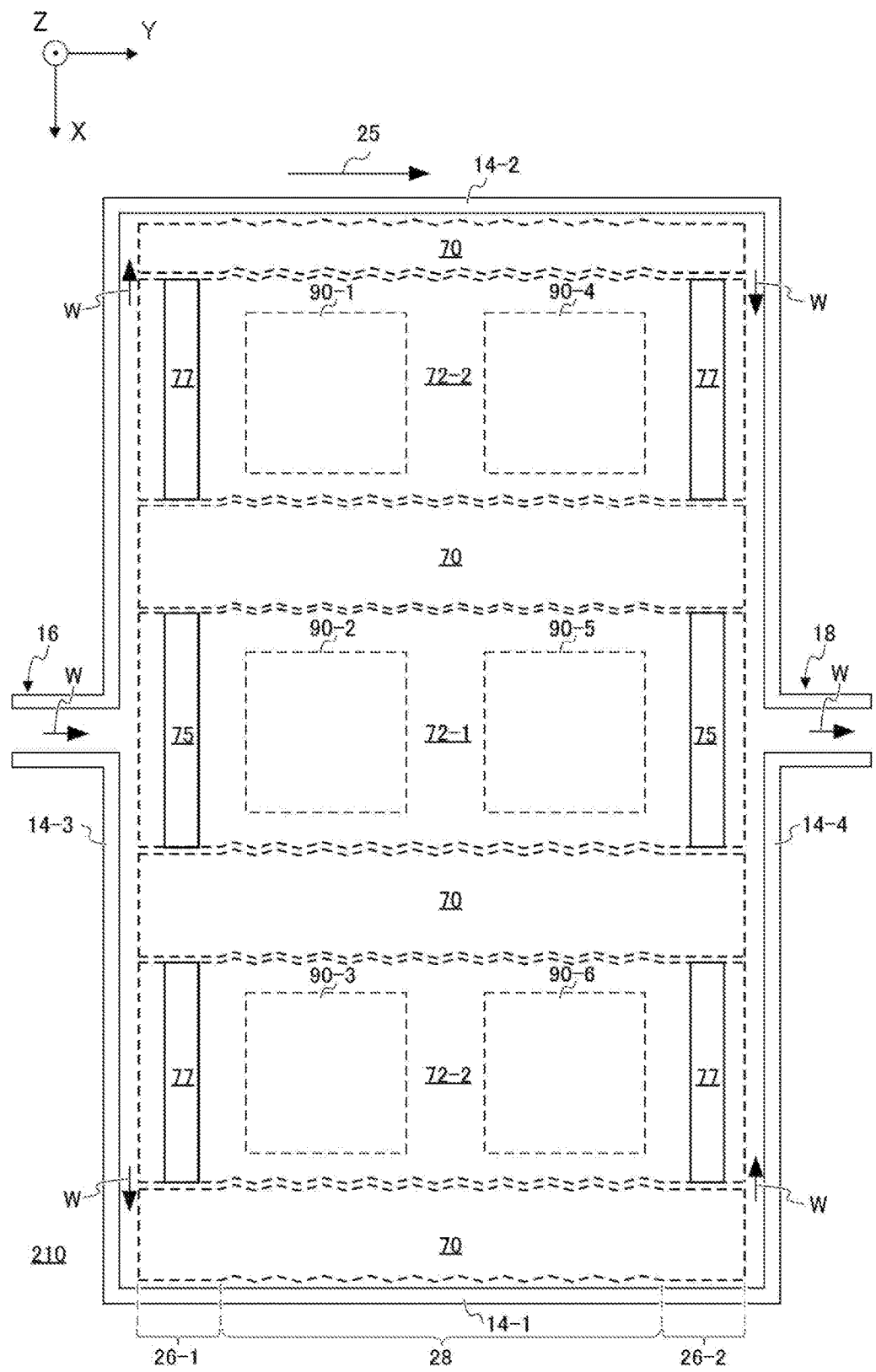
FIG. 18 shows how the inlet 16 and the outlet 18 are positioned relative to the through holes in a semiconductor module 210 relating to a second embodiment.

FIG. 18 shows how the inlet 16 and the outlet 18 are positioned relative to the through holes in a semiconductor module 210 relating to a second embodiment. In the present example, the inlet 16 and the outlet 18 of the cooling water are positioned to overlap each other in the extending direction 25. In this case, the cooling water more easily flows in the flow channels that are close to the inlet 16 or outlet 18 and less easily flows in the flow channels that are distant from the inlet 16 or outlet 18.

Considering this, in the present example, the flow channel that is the closest to the inlet 16 or outlet 18 in the X-axis direction and that runs below the semiconductor chips 90 is configured as the second flow channel 72-1, which has the small through holes 75. On the other hand, the flow channels that are the most distant from the inlet 16 or outlet 18 in the X-axis direction and run below the semiconductor chips 90 are configured as the second flow channels 72-2, which have the large through holes 77. In this manner, the imbalance in the flow rate among the second flow channels 72 can be reduced. In addition, the present example has some configurations in common with the first embodiment, which can produce the same advantageous effects. Note that the cooling water may also flow in the X-axis direction while running through the flow channel extending from the inlet 16 to the outlet 18. For example, in the vicinity of the side plate 14-3, the flow of the cooling water W can branch in the +−X directions after the inlet 16. In addition, for example, in the vicinity of the side plate 14-4, the flow of the cooling water W in the +−X directions proceeds toward the outlet 18.

Figure 19:
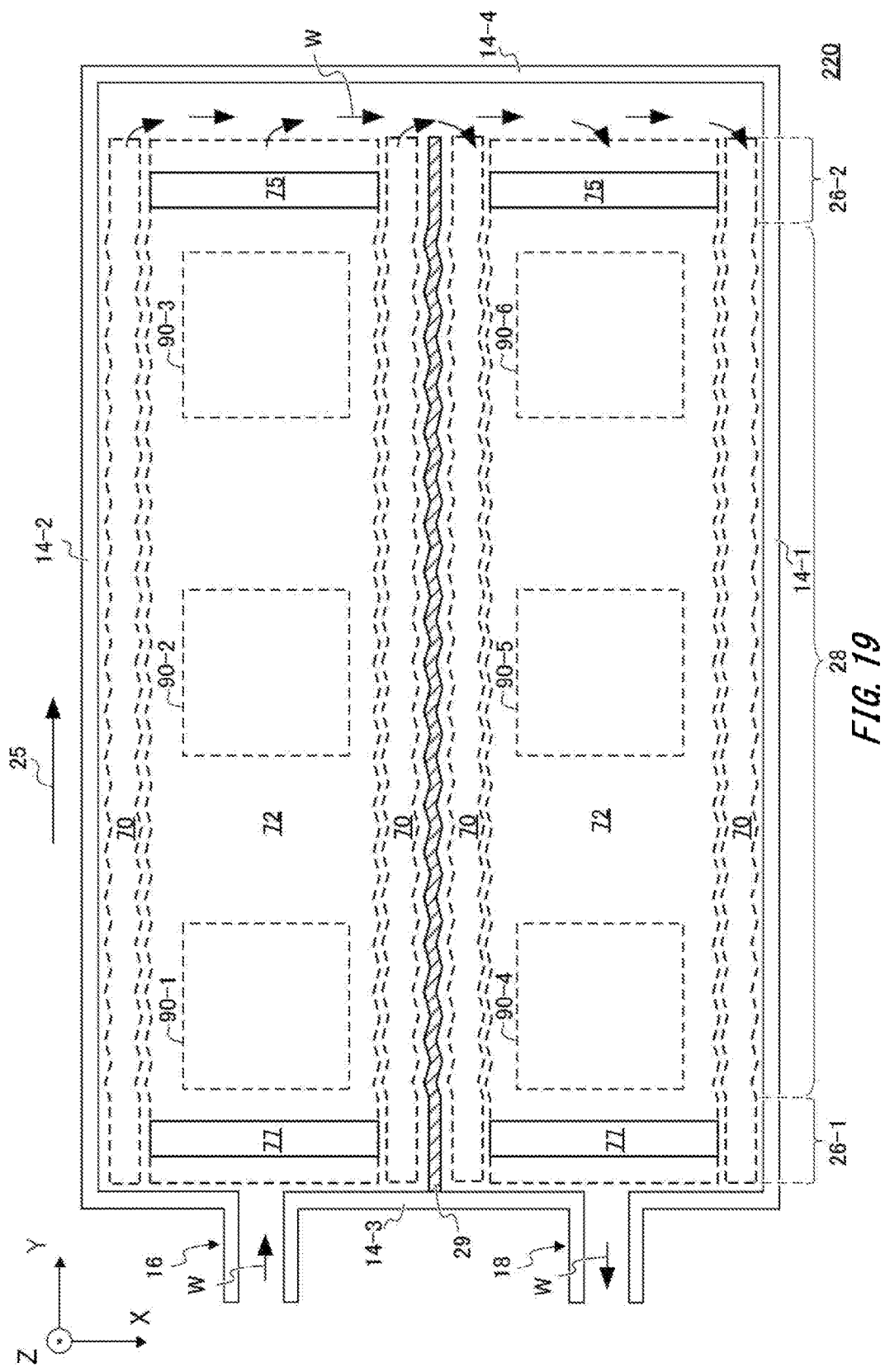
FIG. 19 shows how the inlet 16 and the outlet 18 are positioned relative to the through holes in a semiconductor module 220 relating to a third embodiment.

FIG. 19 shows how the inlet 16 and the outlet 18 are positioned relative to the through holes in a semiconductor module 220 relating to a third embodiment. In the present example, the plurality of semiconductor chips 90 are arranged differently than in the above-described example To be specific, two semiconductor chips 90 are arranged next to each other in the X-axis direction and three semiconductor chips 90 are arranged next to each other in the Y-axis direction. In total, six semiconductor chips 90 (=2×3) are arranged on the upper plate 10. Note that the arrows W indicate the direction in which the cooling water W mainly flows.

The inlet 16 and the outlet 18 of the cooling water are both provided on the same side with respect to the plate-like fins 20 in the extending direction 25. In the present example, the inlet 16 and the outlet 18 are both coupled to the side plate 14-3 while being spaced away from each other in the X-axis direction. In addition, the semiconductor module 220 of the present example includes a partitioning plate-like fin 29 between the inlet 16 and the outlet 18. The partitioning plate-like fin 29 extends in the extending direction 25 from the side plate 14-3 but does not reach the side plate 14-4. The partitioning plate-like fin 29 may be capable of blocking the path that may extend along the side plate 14-3 from the inlet 16 to the outlet 18. In the present example, the cooling water can flow in a substantially U-shaped manner. To be more specific, the cooling water of the present example can enter through the inlet 16 formed in the side plate 14-3, flow toward the side plate 14-4, which faces the side plate 14-3 in the extending direction 25, subsequently flow in the X-axis direction in the vicinity of the side plate 14-4, and finally leave the side plate 14-4 and flow toward the outlet 18 formed in the side plate 14-3.

The large through holes 77 may be positioned closer to the inlet 16 and the outlet 18 than the small through holes 75 are. In the present example, the large through holes 77 and the small through holes 75 are respectively arranged in the upstream and downstream portions in the second flow channel 72 that is the closest to the inlet 16. On the other hand, the small through holes 75 and the large through holes 77 are respectively arranged in the upstream and downstream portions in the second flow channel 72 that is the closest to the outlet 18. Since the cooling water vigorously flows in through the inlet 16, the cooling water can still vigorously flow in the vicinity of the side plate 14-4.

Therefore, in the present example, the small through holes 75 are positioned in the vicinity of the side plate 14-4, instead of the large through holes 77. The present example has some configurations in common with the first embodiment, which can produce the same advantageous effects.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A cooler for cooling a semiconductor chip, comprising:
an upper plate configured to have a semiconductor chip to be arranged thereon;
a plurality of plate-like fins that are arranged under the upper plate and form a flow channel for cooling water therebetween; and
a coupling bar coupled to the plurality of plate-like fins, wherein
the coupling bar has a main-body portion and a plurality of comb-tooth portions, and each of the comb-tooth portions protrudes from the main-body portion into the flow channel,
the cooler comprises a plurality of openings in a plane orthogonal to an extending direction in which the plurality of plate-like fins extend when the cooler is seen from above, and the plurality of openings are defined at least by the plurality of comb-tooth portions and the plurality of plate-like fins, and
the plurality of openings include:
a first opening that is provided in a first flow channel that does not run below the semiconductor chip; and
a second opening that is provided in a second flow channel that runs below the semiconductor chip, the second opening being larger than the first opening.

2. The cooler as set forth in claim 1, wherein
the coupling bar includes a front upper coupling bar and a front lower coupling bar,
the front upper coupling bar and the front lower coupling bar are differently positioned in the extending direction between an inlet of the cooling water and a region that is positioned below the semiconductor chip,
the front upper coupling bar is coupled with upper portions of the plurality of plate-like fins and positioned closer to the inlet of the cooling water than to the region that is positioned below the semiconductor chip, and
the front lower coupling bar is coupled with lower portions of the plurality of plate-like fins and positioned closer to the region that is positioned below the semiconductor chip than to the inlet of the cooling water.

3. The cooler as set forth in claim 2, wherein
in the second flow channel that runs below the semiconductor chip, the comb-tooth portions of the front lower coupling bar do not overlap the comb-tooth portions of the front upper coupling bar in the extending direction.

4. The cooler as set forth in claim 2, wherein
in the first flow channel that does not run below the semiconductor chip, the comb-tooth portions of the front lower coupling bar at least partly overlap the comb-tooth portions of the front upper coupling bar in the extending direction.

5. The cooler as set forth in claim 4, wherein
in the first flow channel that does not run below the semiconductor chip,
upper ends of the comb-tooth portions of the front lower coupling bar are positioned higher than a lower end of the main-body portion of the front upper coupling bar, or
lower ends of the comb-tooth portions of the front upper coupling bar are positioned lower than an upper end of the main-body portion of the front lower coupling bar.

6. The cooler as set forth in claim 2, comprising
a plurality of the second flow channels, wherein
the plurality of second flow channels each include, in a plane that is positioned between the front upper coupling bar and the inlet and orthogonal to the extending direction, one of:
a large through hole that includes an overlap in the extending direction between the second opening and a fourth opening having a relatively larger opening area, an upper end of the second opening being defined by the comb-tooth portions of the front upper coupling bar, a lower end of the fourth opening being defined by the comb-tooth portions of the front lower coupling bar; and
a small through hole that includes an overlap in the extending direction between the second opening and a fourth opening having a relatively smaller opening area.

7. The cooler as set forth in claim 2, wherein
the inlet and an outlet of the cooling water are differently positioned in the extending direction with the plurality of plate-like fins being sandwiched therebetween,
the cooler comprises a plurality of the second flow channels,
the plurality of second flow channels each include, in a plane that is positioned between the front upper coupling bar and the inlet and orthogonal to the extending direction, one of:
a large through hole that includes an overlap in the extending direction between the second opening and a fourth opening having a relatively larger opening area, an upper end of the second opening being defined by the comb-tooth portions of the front upper coupling bar, a lower end of the fourth opening being defined by the comb-tooth portions of the front lower coupling bar; and
a small through hole that includes an overlap in the extending direction between the second opening and a fourth opening having a relatively smaller opening area, and the small through hole is positioned closer to the inlet or the outlet than the large through hole is.

8. The cooler as set forth in claim 2, wherein
the inlet and an outlet of the cooling water are both provided on a same side with respect to the plurality of plate-like fins in the extending direction,
the cooler comprises a plurality of the second flow channels, the plurality of second flow channels each include, in a plane that is positioned between the front upper coupling bar and the inlet and orthogonal to the extending direction, one of:
a large through hole that includes an overlap in the extending direction between the second opening and a fourth opening having a relatively larger opening area, an upper end of the second opening being defined by the comb-tooth portions of the front upper coupling bar, a lower end of the fourth opening being defined by the comb-tooth portions of the front lower coupling bar; and
a small through hole that includes an overlap in the extending direction between the second opening and a fourth opening having a relatively smaller opening area, and
the large through hole is positioned closer to the inlet and the outlet than the small through hole is.

9. The cooler as set forth in claim 2, further comprising
at least one coupling bar that is positioned between the region that is positioned below the semiconductor chip and an outlet of the cooling water in the extending direction.

10. The cooler as set forth in claim 9, comprising
a back upper coupling bar and a back lower coupling bar that correspond to the at least one coupling bar and are differently positioned in the extending direction between the region that is positioned below the semiconductor chip and the outlet of the cooling water,
the back upper coupling bar is coupled with the upper portions of the plurality of plate-like fins and positioned closer to the outlet of the cooling water than to the region that is positioned below the semiconductor chip, and
the back lower coupling bar is coupled with the lower portions of the plurality of plate-like fins and positioned closer to the region that is positioned below the semiconductor chip than to the outlet of the cooling water.

11. The cooler as set forth in claim 10, wherein
a distance between the front upper coupling bar and the front lower coupling bar is shorter than a distance between the back upper coupling bar and the back lower coupling bar.

12. The cooler as set forth in claim 10, wherein
in the first flow channel that does not run below the semiconductor chip, a length of an overlap, in the extending direction, between the comb-tooth portions of the front upper coupling bar and the comb-tooth portions of the front lower coupling bar is larger than a length of an overlap, in the extending direction, between the comb-tooth portions of the back upper coupling bar and the comb-tooth portions of the back lower coupling bar.

13. The cooler as set forth in claim 10, wherein
in the second flow channel that runs below the semiconductor chip, a protruding length of the comb-tooth portions of the back lower coupling bar is larger than a protruding length of the comb-tooth portions of the front lower coupling bar.

14. The cooler as set forth in claim 1, wherein
the plurality of plate-like fins each have a depression in which the coupling bar is arranged, and
the depression has a protrusion that is in contact with the coupling bar in a direction parallel to the extending direction.

15. The cooler as set forth in claim 1, wherein
the coupling bar includes at least two coupling bars that are spaced away from each other in the extending direction and positioned between an inlet of the cooling water and a region that is positioned below the semiconductor chip, or between the region that is positioned below the semiconductor chip and an outlet of the cooling water, and
a distance between two of the coupling bars in the extending direction is equal to or larger than a thickness, in the extending direction, of a main-body portion of each of the two coupling bars.

* * * * *